US012568720B2

(12) United States Patent
Oh et al.

(10) Patent No.: US 12,568,720 B2
(45) Date of Patent: Mar. 3, 2026

(54) LIGHT EMITTING DIODE AND DISPLAY APPARATUS HAVING THE SAME

(71) Applicant: SEOUL VIOSYS CO., LTD., Ansan-si (KR)

(72) Inventors: Se Hee Oh, Ansan-si (KR); Sang Won Woo, Ansan-si (KR); Wan Tae Lim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 578 days.

(21) Appl. No.: 18/169,499

(22) Filed: Feb. 15, 2023

(65) Prior Publication Data

US 2023/0215990 A1 Jul. 6, 2023

Related U.S. Application Data

(63) Continuation of application No. PCT/KR2021/010996, filed on Aug. 19, 2021.

(30) Foreign Application Priority Data

Aug. 19, 2020 (KR) ......................... 10-2020-0104101
Aug. 18, 2021 (KR) ......................... 10-2021-0108468

(51) Int. Cl.
*H10H 20/841* (2025.01)
*H01L 25/075* (2006.01)
*H10H 20/833* (2025.01)

(52) U.S. Cl.
CPC ....... *H10H 20/841* (2025.01); *H01L 25/0753* (2013.01); *H10H 20/833* (2025.01)

(58) Field of Classification Search
CPC .... H10H 20/841; H10H 20/833; H10H 20/82; H10H 20/84; H10H 20/819;

(Continued)

(56) References Cited

U.S. PATENT DOCUMENTS

2011/0127549 A1* 6/2011 Lee ...................... H10H 20/856
257/E33.074
2012/0025244 A1 2/2012 Suh et al.
(Continued)

FOREIGN PATENT DOCUMENTS

CN 111146321 A 5/2020
KR 10-2011-0093587 A 8/2011
(Continued)

OTHER PUBLICATIONS

Supplementary European Search Report for corresponding European Application No. 21858596, dated Jun. 28, 2024.
(Continued)

*Primary Examiner* — Mark W Tornow
(74) *Attorney, Agent, or Firm* — Perkins Coie LLP

(57) ABSTRACT

A light emitting diode is provided to include a substrate; a light emitting structure disposed on the substrate, and including first and second semiconductor layers; a transparent electrode in ohmic contact with the second semiconductor layer; a contact electrode disposed on the first semiconductor layer; a current spreader disposed on the transparent electrode; a first insulation reflection layer covering the substrate, the light emitting structure, the transparent electrode, the contact electrode, and the current spreader, having openings exposing portions of the contact electrode and the current spreader, and including a distributed Bragg reflector; first and second pad electrodes disposed on the first insulation reflection layer and connected to the contact electrode and the current spreader through the openings; and a second insulation reflection layer disposed under the substrate and including a distributed Bragg reflector.

21 Claims, 14 Drawing Sheets

(58) Field of Classification Search
CPC .... H10H 20/831; H10H 20/857; H10H 29/14;
H10H 29/142; H01L 25/0753; G02F
1/133603
See application file for complete search history.

(56) References Cited

U.S. PATENT DOCUMENTS

| | | | | |
|---|---|---|---|---|
| 2017/0108173 | A1* | 4/2017 | Kim | H10H 20/831 |
| 2018/0138368 | A1* | 5/2018 | Jang | H10H 20/814 |
| 2019/0051805 | A1* | 2/2019 | Oh | H10H 20/84 |
| 2020/0127167 | A1* | 4/2020 | Lee | H10H 20/841 |
| 2021/0359188 | A1* | 11/2021 | Kim | H10H 29/142 |

FOREIGN PATENT DOCUMENTS

| | | | |
|---|---|---|---|
| KR | 10-2016-0025328 | A | 3/2016 |
| KR | 10-2020-0034425 | A | 3/2020 |
| KR | 10-2020-0045861 | A | 5/2020 |

OTHER PUBLICATIONS

International Search Report from PCT/KR2021/010996, dated Nov. 30, 2021 (3 pages).

* cited by examiner

LIGHT EMITTING DIODE AND DISPLAY APPARATUS HAVING THE SAME

CROSS-REFERENCE TO RELATED APPLICATIONS

This application is a continuation of International Patent Application No. PCT/KR2021/010996, filed on Aug. 19, 2021, which further claims priority to and benefits of Korean Patent Application No. 10-2020-0104101, filed on Aug. 19, 2020, and Korean Patent Application No. 10-2021-0108468, filed on Aug. 18, 2021. The entire contents of the above noted applications are incorporated by reference as part of the disclosure of this document.

TECHNICAL FIELD

The present disclosure relates to a light emitting diode and a display apparatus having the same, and more particularly to a light emitting diode having a plurality of light emitting cells and a display apparatus having the same.

BACKGROUND

Light emitting diodes are used in various products, such as back light units (BLU), general lighting and electronic devices, and also used in small home appliances and interior products. Moreover, the light emitting diodes can be used for various purposes, such as conveying meaning and arousing an aesthetic sense, in addition to simply being used as a light source.

SUMMARY

In one aspect, a light emitting diode is provided to include: a substrate; a light emitting structure disposed on the substrate, and including a first conductivity type semiconductor layer, an active layer, and a second conductivity type semiconductor layer; a transparent electrode disposed on and in ohmic contact with the second conductivity type semiconductor layer; a contact electrode disposed on the first conductivity type semiconductor layer; a current spreader disposed on the transparent electrode; a first insulation reflection layer covering the substrate, the light emitting structure, the transparent electrode, the contact electrode, and the current spreader, having openings exposing portions of the contact electrode and the current spreader, and including a distributed Bragg reflector; a first pad electrode and a second pad electrode disposed on the first insulation reflection layer, and connected to the contact electrode and the current spreader through the openings, respectively; and a second insulation reflection layer disposed under the substrate, and including a distributed Bragg reflector, in which a reflection band of the second insulation reflection layer is narrower than a reflection band of the first insulation reflection layer.

In another aspect, a light emitting diode is provided to include: a substrate; a first light emitting cell and a second light emitting cell disposed on the substrate, and including a first conductivity type semiconductor layer, an active layer, and a second conductivity type semiconductor layer, respectively; transparent electrodes disposed on and in ohmic contact with the second conductivity type semiconductor layer of each of the first light emitting cell and the second light emitting cell; a contact electrode disposed on the first conductivity type semiconductor layer of the second light emitting cell; a current spreader disposed on the transparent electrode on the first light emitting cell; a connection electrode electrically connecting the first conductivity type semiconductor layer of the first light emitting cell and the second conductivity type semiconductor layer of the second light emitting cell; a first insulation reflection layer covering the substrate, the first light emitting cell and the second light emitting cell, the transparent electrodes, the contact electrode, the connection electrode, and the current spreader, having openings exposing portions of the contact electrode and the current spreader, and including a distributed Bragg reflector; a first pad electrode and a second pad electrode disposed on the first insulation reflection layer, and connected to the contact electrode and the current spreader through the openings, respectively; and a second insulation reflection layer disposed under the substrate, and including a distributed Bragg reflector.

In another aspect, a display apparatus is provided to include a circuit board and the light emitting diode arranged on the circuit board.

According to embodiments of the present disclosure, it is possible to provide a light emitting diode emitting light to a side by employing a first insulation reflection layer and a second insulation reflection layer, and to adjust a viewing angle of light by controlling reflectance of the second insulation reflection layer. Furthermore, light proceeding toward the first and second pad electrodes can be reflected using the first insulation reflection layer, thereby reducing light loss caused by metallic layers. In addition, it is possible to provide a light emitting diode configured to be driven under a high voltage by connecting first and second light emitting cells in series.

Other features and advantages of the present disclosure will be clearly understood from the detailed description set forth below.

DETAILED DESCRIPTION

Figure 1:
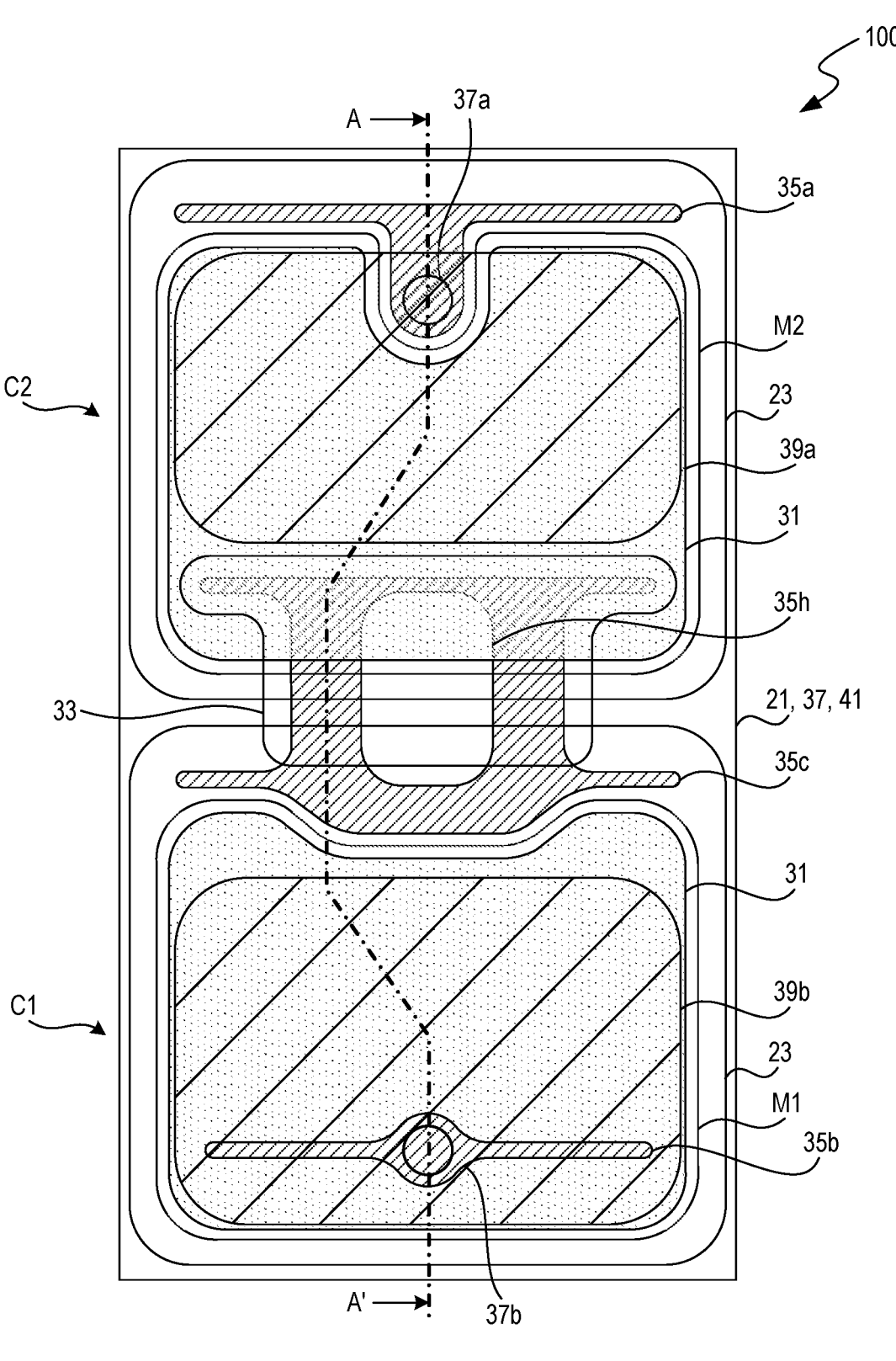
FIG. 1 is a schematic plan view illustrating a light emitting diode according to an embodiment of the present disclosure.

Hereinafter, exemplary embodiments of the present disclosure will be described in detail with reference to the accompanying drawings. The following exemplary embodiments are provided by way of example. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

According to an embodiment of the present disclosure, a light emitting diode is provided, the light emitting diode, including: a substrate; a light emitting structure disposed on the substrate, and including a first conductivity type semiconductor layer, an active layer, and a second conductivity type semiconductor layer; a transparent electrode disposed on and in ohmic contact with the second conductivity type semiconductor layer; a contact electrode disposed on the first conductivity type semiconductor layer; a current spreader disposed on the transparent electrode; a first insulation reflection layer covering the substrate, the light emitting structure, the transparent electrode, the contact electrode, and the current spreader, having openings exposing portions of the contact electrode and the current spreader, and including a distributed Bragg reflector; a first pad electrode and a second pad electrode disposed on the first insulation reflection layer, and connected to the contact electrode and the current spreader through the openings, respectively; and a second insulation reflection layer disposed under the substrate, and including a distributed Bragg reflector, in which a reflection band of the second insulation reflection layer is narrower than a reflection band of the first insulation reflection layer.

The contact electrode and the current spreader may have a same layer structure.

The reflection bands of the first and second insulation reflection layers may have reflectance of 98% or more.

A length of the contact electrode may be longer than that of the current spreader.

At least a portion of light generated in the active layer may be reflected from the second insulation reflection layer and emitted sidewards.

In an embodiment, the first insulation reflection layer may have the reflectance of 95% or more within a wavelength range of 410 nm to 700 nm, and the second insulation reflection layer may have the reflectance of 95% or more within a wavelength range of 370 nm to 520 nm.

In an embodiment, the first insulation reflection layer may have the reflectance of 98% or more within a wavelength range of 410 nm to 690 nm, and the second insulation reflection layer may have the reflectance of 98% or more within a wavelength range of 380 nm to 500 nm.

Within a wavelength range of 550 nm to 700 nm, the reflectance of the second insulation reflection layer may be lower than that of the first insulation reflection layer.

The second insulation reflection layer may have a first reflectance lower than the reflectance of the first insulation reflection layer at a first incident angle within a range of 0 to 90 degrees.

The second insulation reflection layer may have a second reflectance lower than the reflectance of the first insulation reflection layer at a second incident angle within the range of 0 to 90 degrees, the first and second reflectances may be local minimum reflectances, and the second reflectance may be different from the first reflectance.

The light emitting diode may exhibit a luminous intensity of a first peak at a first viewing angle between 0 degrees and 90 degrees.

The luminous intensity of the light emitting diode at the viewing angle of 0 degrees may be greater than a luminous intensity at the viewing angle of 90 degrees and less than the luminous intensity of the first peak.

In the light emitting diode, the luminous intensity may increase as the viewing angle increases from 0 degree to the first viewing angle.

The first viewing angle may be greater than 50 degrees.

The contact electrode and the current spreader may include an ohmic metal layer for ohmic contact with the first conductivity type semiconductor layer and a metal reflection layer for reflecting light generated in the active layer.

With respect to light generated in the active layer at a specific incident angle, the first insulation reflection layer may have the reflectance of 90% or more, and the second insulation reflection layer may have the reflectance of 90% or less.

The second insulation reflection layer may have the reflectance of 50% or less at the specific incident angle.

The substrate may have a rectangular shape having a major axis and a minor axis, and at least one of side surfaces of the substrate may be inclined at an inclination angle of 80 degrees to 85 degrees with respect to a lower surface of the substrate.

The substrate may include a roughened surface on the side surface.

The roughened surface may be formed along a periphery of the substrate.

According to an embodiment of the present disclosure, a light emitting diode is provided, the light emitting diode, including: a substrate; a first light emitting cell and a second light emitting cell disposed on the substrate, and including a first conductivity type semiconductor layer, an active layer, and a second conductivity type semiconductor layer, respectively; transparent electrodes disposed on and in ohmic contact with the second conductivity type semiconductor layer of each of the first light emitting cell and the second light emitting cell; a contact electrode disposed on the first conductivity type semiconductor layer of the second light emitting cell; a current spreader disposed on the transparent electrode on the first light emitting cell; a connection electrode electrically connecting the first conductivity type semiconductor layer of the first light emitting cell and the second conductivity type semiconductor layer of the second light emitting cell; a first insulation reflection layer covering the substrate, the first light emitting cell and the second light emitting cell, the transparent electrodes, the contact electrode, the connection electrode, and the current spreader, having openings exposing portions of the contact electrode and the current spreader, and including a distributed Bragg reflector; a first pad electrode and a second pad electrode disposed on the first insulation reflection layer, and connected to the contact electrode and the current spreader through the openings, respectively; and a second insulation reflection layer disposed under the substrate, and including a distributed Bragg reflector.

The contact electrode, the connection electrode, and the current spreader may have a same layer structure.

In addition, the connection electrode may have one end disposed on the first light emitting cell and the other end disposed on the second light emitting cell, and a width of the one end may be greater than that of the other end.

A length of the current spreader may be smaller than a width of the one end, and a length of the contact electrode may be longer than the length of the current spreader.

In the example, the connection electrode may further include an intermediate portion disposed between the one end and the other end, and the intermediate portion may have a width smaller than those of the one end and the other end.

The light emitting diode may further include a lower insulation layer disposed under the connection electrode to insulate the connection electrode from the first conductivity type semiconductor layer of the first light emitting cell.

Furthermore, a lateral width of the lower insulation layer may be smaller than a lateral width of the transparent electrode on the second light emitting cell.

The transparent electrode on the second light emitting cell may partially cover the lower insulation layer, and the one end of the connection electrode may be connected to the transparent electrode.

The connection electrode may have an opening exposing the lower insulation layer.

In addition, the connection electrode may provide a plurality of current paths between the first light emitting cell and the second light emitting cell.

The contact electrode, the connection electrode, and the current spreader may include an ohmic metal layer for ohmic contact with the first conductivity type semiconductor layer and a metal reflection layer for reflecting light generated in the active layer.

In an embodiment, both the first and second insulation reflection layers may have reflectance of 90% or more. In another embodiment, the first insulation reflection layer may have the reflectance of 90% or more, and the second insulation reflection layer may have the reflectance of 90% or less. Furthermore, the second insulation reflection layer may have the reflectance of 50% or less.

The substrate may have a rectangular shape having a major axis and a minor axis, and at least one of side surfaces of the substrate may be inclined at an inclination angle of 80 degrees to 85 degrees with respect to a lower surface of the substrate.

The substrate may include a roughened surface on the side surface. The roughened surface may be formed along a periphery of the substrate.

The light emitting diode may include another second electrode pad spaced apart from the second electrode pad over the first light emitting cell; and another first electrode pad spaced apart from the first electrode pad over the second light emitting cell.

A difference between a light emitting area of the first light emitting cell and a light emitting area of the second light emitting cell may be less than 10%.

The first light emitting cell and the second light emitting cell may have a first mesa and a second mesa including the second conductivity type semiconductor layer and the active layer, respectively, and the first mesa and the second mesa have indent portions having different shapes from each other, respectively.

The substrate may be a patterned sapphire substrate.

In the conventional art, flip chip type light emitting diodes have been generally manufactured in order to provide high efficiency light emitting diodes. The flip chip type light emitting diodes have favorable heat dissipation performance and provide the improved light extraction efficiency using a reflection layer. Since a flip bonding technology is used, a bonding interconnection can be omitted, thereby improving a stability of a light emitting apparatus. When the flip chip type light emitting diodes are used in the back light unit, however, light is emitted with upward straightness. Accordingly, a spot phenomenon may occur on a display surface. In order to prevent this, a technology of dispersing light by disposing a diffusion plate or a filter over the light emitting diode is used, but accordingly, light loss is inevitable. Meanwhile, the flip chip light emitting diode generally uses a metal reflection layer to reflect light. Since the metal reflection layer has both ohmic characteristics and reflection characteristics, electrical connection and light reflection can be simultaneously achieved. However, since the reflectance of the metal reflection layer is not relatively high, considerable light loss occurs. Furthermore, as the light emitting diode is used for a long time, the reflectance of the metal reflection layer may decrease. Accordingly, a flip chip type light emitting diode configured to reduce light loss due to the use of the metal reflection layer is required. Furthermore, it is necessary to increase a current density in order to increase a luminous intensity of the light emitting diode. Although the current density can be increased by increasing an input current, power loss increases as the current increases. Accordingly, a light emitting diode chip using a plurality of light emitting cells connected in series has been used. Since the plurality of light emitting cells connected in series is driven, an input voltage can be increased, and thus, the luminous intensity of the light emitting diode may increase while reducing power loss.

Some implementations of the disclosed technology are suggested to provide a light emitting device to solve the issues recognized above. Exemplary embodiments of the present disclosure provide a light emitting diode configured to disperse light over a wide region without using a diffusion plate or a filter. Exemplary embodiments of the present disclosure provide a light emitting diode configured to improve luminous efficiency by reducing light loss due to a metal reflection layer. Exemplary embodiments of the present disclosure provide a structurally simple and miniaturized light emitting diode including a plurality of light emitting cells.

Hereinafter, exemplary embodiments of the present disclosure will be described in detail with reference to the accompanying drawings.

Figure 2:
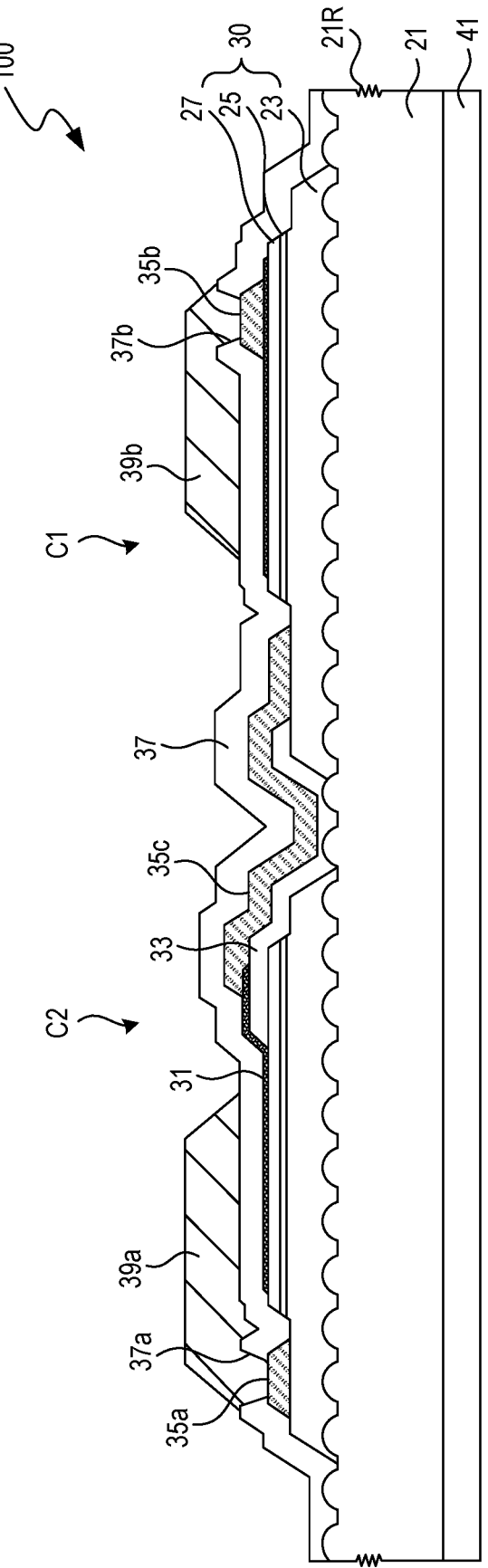
FIG. 2 is a cross-sectional view taken along line A-A' in FIG. 1.

FIG. 1 is a schematic plan view illustrating a light emitting diode 100 according to an embodiment of the present disclosure, and FIG. 2 is a schematic cross-sectional view taken along line A-A' of FIG. 1.

Referring to FIGS. 1 and 2, the light emitting diode 100 according to this embodiment may include a substrate 21, light emitting cells C1 and C2, transparent electrodes 31, a lower insulation layer 33, a contact electrode 35a, a current spreader 35b, a connection electrode 35c, a first insulation reflection layer 37, a second insulation reflection layer 41, a first pad electrode 39a, and a second pad electrode 39b. The light emitting cells C1 and C2 include a light emitting structure 30 including a first conductivity type semiconductor layer 23, an active layer 25, and a second conductivity type semiconductor layer 27.

As shown in FIG. 1, the light emitting diode may have an elongated rectangular shape having a long axis and a short axis, and may be a small light emitting diode having a relatively small horizontal cross-sectional area. A length of the light emitting diode in a longitudinal direction may be same as or less than twice of a length in a transverse direction. For example, the length of the light emitting diode in the longitudinal direction may be 400 um and the length in the transverse direction may be 220 um. In addition, a total thickness of the light emitting diode may be within a range of about 100 um to 200 um.

The substrate 21 may be an insulating or conductive substrate. However, when the substrate 21 is a conductive substrate, it may be surface-treated to have an insulating surface, or an insulation layer may be added to a surface of the substrate 21. The substrate 21 may be a growth substrate for growing the light emitting structure 30, and may include a sapphire substrate, a silicon carbide substrate, a silicon substrate, a gallium nitride substrate, an aluminum nitride substrate, and the like. In addition, the substrate 21 may include a plurality of protrusions formed on at least a partial region of an upper surface thereof. The plurality of protrusions of the substrate 21 may be formed in a regular or irregular pattern. For example, the substrate 21 may be a patterned sapphire substrate (PSS) including the plurality of protrusions formed on the upper surface thereof. The substrate 21 may have a thickness within a range of approximately 100 um to 200 um.

The substrate 21 may also include a roughened surface 21R on a side surface thereof. The roughened surface 21R may be formed on each of the side surfaces along a periphery of the substrate 21 near a central portion of the substrate 21. The roughened surface 21R may be formed by using a stealth laser when dicing the substrate 21, and improves an extraction efficiency of light through the side surface of the substrate 21.

The light emitting cells C1 and C2 are positioned on the substrate 21. The light emitting cells C1 and C2 may be arranged along a direction of the long axis of the substrate 21. Each of the light emitting cells C1 and C2 may have a substantially square shape, without being limited thereto. The upper surface of the substrate 21 is exposed along a periphery of the light emitting structure 30. Portions of the plurality of protrusions on the upper surface of the substrate 21 are positioned between the light emitting structure 30 and the substrate 21, and protrusions not covered by the light emitting structure 30 are exposed around the light emitting structure 30.

By exposing the upper surface of the substrate 21 in a region between the light emitting structures 30 and in an isolation region around the light emitting structures 30, bowing which would have been occurred during a manufacturing process of the light emitting diode may be reduced. Accordingly, the light emitting structure 30 may be prevented from being damaged due to the bowing, thereby improving a manufacturing yield of the light emitting diode. In addition, since the bowing is reduced, a stress applied to the light emitting structure 30 may be reduced, so that the thickness of the substrate 21 may be processed to be smaller. Accordingly, a slimmed-down light emitting diode having a small thickness of about 100 µm may be provided.

The light emitting structure 30 includes the first conductivity type semiconductor layer 23, the second conductivity type semiconductor layer 27 disposed on the first conductivity type semiconductor layer 23, and an active layer 25 disposed between the first conductivity type semiconductor layer 23 and the second conductivity type semiconductor layer 27. A total thickness of the light emitting structure 30 may be within a range of about 5 um to about 10 um.

In some implementations, the first conductivity type semiconductor layer 23, the active layer 25, and the second conductivity type semiconductor layer 27 may include a III-V nitride-based semiconductor, and for example, may include a nitride-based semiconductor, such as (Al, Ga, In)N. The first conductivity type semiconductor layer 23 may include an n-type impurity (e.g., Si, Ge, Sn), and the second conductivity type semiconductor layer 27 may include a p-type impurity (e.g., Mg, Sr, Ba). Alternatively, the opposite may be possible. The active layer 25 may include a multi-quantum well structure (MQW), and a composition ratio of the nitride-based semiconductor may be adjusted to emit light of a desired wavelength. In particular, in this embodiment, the second conductivity type semiconductor layer 27 may be a p-type semiconductor layer.

The first conductivity type semiconductor layer 23 may have an inclined side surface. Furthermore, an inclination angle of the inclined side surface may be as gentle as about 45 degrees or less with respect to a bottom surface of the substrate 21. By gently forming the side surface of the first conductivity type semiconductor layer 23, defects such as cracks may be prevented from occurring in the first insulation reflection layer 37 covering the light emitting structure 30 and the substrate 21.

In some implementations, the light emitting structures 30 include mesas M1 and M2. Each of the mesas M1 and M2 may be positioned on a partial region of the first conductivity type semiconductor layer 23, and includes the active layer 25 and the second conductivity type semiconductor layer 27. The mesas M1 and M2 may have a thickness within a range of about 1 um to about 2 um. In this embodiment, a portion of the first conductivity type semiconductor layer 23 may be exposed outside of the mesas M1 and M2. In this embodiment, an upper surface of the first conductivity type semiconductor layer 23 may be exposed along peripheries of the mesas M1 and M2. However, the inventive concepts are not limited thereto, and some inclined surfaces of the mesas M1 and M2 may be flush with the side surfaces of the first conductivity type semiconductor layer 23. In addition, in another embodiment, a through hole or a through groove may be formed inside the mesas M1 and M2 to expose the first conductivity type semiconductor layer 23.

The mesas M1 and M2 may have inclined side surfaces, and an inclination angle of the side surface may be gentle, less than about 45 degrees with respect to the bottom surface of the substrate 21. Furthermore, when the side surfaces of the first conductivity type semiconductor layer 23 and the mesas M1 and M2 are flush, the first conductivity type semiconductor layer 23 and the mesas M1 and M2 may form a same inclined surface.

The mesas M1 and M2 of the first light emitting cell C1 and the second light emitting cell C2 may have substantially a same area as each other, and thus, the first light emitting cell C1 and the second light emitting cell C2 may be driven under a same current density. However, the inventive concepts are not limited thereto, and the mesas M1 and M2 of the first light emitting cell C1 and the second light emitting cell C2 may have different areas from each other. However, a difference between the areas of the mesas M1 and M2, that is, the difference between the light emitting areas of the first and second light emitting cells C1 and C2 may be less than 10%.

In some implementations, the mesas M1 and M2 of the first light emitting cell C1 and the second light emitting cell C2 may have substantially similar shapes to each other, without being limited thereto. As shown in FIG. 1, both the first light emitting cell C1 and the second light emitting cell C2 include indent portions, respectively, but their shapes may be different. For example, the indent portion formed in the mesa M1 of the first light emitting cell C1 may be wider than the indent portion formed in the mesa M2 of the second light emitting cell C2. In another embodiment, the indent portions formed in the mesas M1 and M2 of the first light emitting cell C1 and the second light emitting cell C2 may have a same shape as each other.

After the first conductivity type semiconductor layer 23, the active layer 25, and the second conductivity type semiconductor layer 27 are sequentially grown on the substrate 21, the mesas M1 and M2 are formed through a mesa etching process, and thereafter, the light emitting structures 30 may be formed by exposing the substrate 21 by patterning the first conductivity type semiconductor layer 27 through a cell isolation process. The cell isolation process may be performed first and the mesa etching process may be performed later.

The lower insulation layer 33 is disposed between the first light emitting cell C1 and the second light emitting cell C2, partially covers the first conductivity type semiconductor layer 23 of the first light cell C1, and also partially covers the second conductivity type semiconductor layer 27 of the second light emitting cell C2. As shown in FIG. 1, a width of the lower insulation layer 33 on the second light emitting cell C2 may be wider than that of the lower insulation layer 33 on the first light emitting cell C1. The lower insulation layer 33 may be formed of a single layer or multiple layers such as a silicon oxide layer or a silicon nitride layer. Furthermore, the lower insulation layer 33 may be formed as a distributed Bragg reflector.

The transparent electrode 31 is positioned on the second conductivity type semiconductor layer 27. The transparent electrode 31 may be in ohmic contact with the second conductivity type semiconductor layer 27. The transparent electrode 31 may include light-transmissive conductive oxide layer, for example, indium tin oxide (ITO), zinc oxide (ZnO), zinc indium tin oxide (ZITO), zinc indium oxide (ZIO), zinc tin oxide (ZTO), gallium indium tin oxide (GITO), gallium indium oxide (GIO), gallium zinc oxide (GZO), aluminum doped zinc oxide (AZO), fluorine tin oxide (FTO), and the like. Conductive oxides may include various dopants.

The transparent electrode 31 including the light-transmissive conductive oxide has favorable ohmic contact characteristics with the second conductivity type semiconductor layer 27. For example, the conductive oxide such as ITO or ZnO has a relatively lower contact resistance with the second conductivity type semiconductor layer 27 than a metallic electrode, and thus, luminous efficiency may be improved by applying the transparent electrode 31 including the conductive oxide, thereby reducing a forward voltage Vf of the light emitting diode.

In particular, in a case of a small light emitting diode such as the light emitting diode of this embodiment, since the current density is relatively low, ohmic characteristics are greatly affected. Therefore, the luminous efficiency may be more effectively improved by improving the ohmic characteristics using the transparent electrode 31. In addition, the conductive oxide is less likely to be peeled from the nitride-based semiconductor layer than the metallic electrode, and is stable even when used for a long time. Therefore, a reliability of the light emitting diode may be improved by using the transparent electrode 31 including the conductive oxide.

A thickness of the transparent electrode 31 is not limited, but may have a thickness within a range of about 400 Å to 3000 Å. When the thickness of the transparent electrode 31 is excessively great, light passing through the transparent electrode 31 may be absorbed and light loss may occur. Therefore, the thickness of the transparent electrode 31 is limited to 3000 Å or less.

The transparent electrode 31 is formed to substantially entirely cover an upper surface of the second conductivity type semiconductor layer 27, and thus, a current spreading efficiency may be improved when driving the light emitting diode. For example, side surfaces of the transparent electrode 31 may be formed along the side surfaces of the mesas M1 and M2.

In some implementations, the transparent electrode 31 on the first light emitting cell C1 may entirely contact the second conductivity type semiconductor layer 27. The transparent electrode 31 on the second light emitting cell C2 generally contacts the second conductivity type semiconductor layer, but a portion thereof may be positioned on the lower insulation layer 33. That is, the transparent electrode 31 on the second light emitting cell C2 may cover the lower insulation layer 33 disposed on the second conductivity type semiconductor layer 27. For example, the transparent electrode 31 may be formed on the second conductivity type semiconductor layer 27 after the light emitting structure 30 is formed and the lower insulation layer 33 is formed, and at this time, it may be formed to partially cover the lower insulation layer 33.

The contact electrode 35a is disposed on the first conductivity type semiconductor layer 23 adjacent to the mesa M2 on the first light emitting cell C1. The contact electrode 35a is in ohmic contact with the first conductivity type semiconductor layer 23. In the implementation, the contact electrode 35a includes a metallic layer in ohmic contact with the first conductivity type semiconductor layer 33.

In some implementations, the contact electrode 35a does not overlap the active layer 25 or the second conductivity type semiconductor layer 27 of the mesa M2, and an insulation layer for insulating the contact electrode 35a from the second conductive semiconductor layer 27 is omitted. The contact electrode 35a may be formed by, for example, a lift-off process, on the light emitting structure 30 on which the transparent electrode 31 is formed. At this time, the current spreader 35b and the connection electrode 35c, which will be described later, may also be formed together.

In some implementations, the contact electrode 35a is spaced apart from the mesa M2 by a sufficient distance, and a separation distance may be greater than a thickness of the first insulation reflection layer 37. The contact electrode 35a may be formed in an elongated shape along one edge of the mesa M2, and may extend into the indent portion of the mesa M2. By forming the contact electrode 35a in the elongated shape along one edge of the mesa M2, current spreading performance in the second light emitting cell C2 may be improved.

The contact electrode 35a may also function as a connection pad of the first pad electrode 39a described later. A connection pad region of the contact electrode 35a may be disposed in the indent portion of the mesa M2, which assists the first pad electrode 39a disposed on the mesa M2 to be easily connected to the contact electrode 35a. Furthermore, a region where the first pad electrode 39a covers the inclined side surface of the mesa M2 may be reduced, and thus, it is possible to prevent the first pad electrode 39a from being electrically shorted to the second conductivity type semiconductor layer 27 through a defect of the first insulation reflection layer 37.

The current spreader 35b is positioned on the transparent electrode 31 on the mesa M1 and electrically connected to the transparent electrode 31. The current spreader 35b may be disposed near one edge of the mesa M1 opposite to the contact electrode 35a. The current spreader 35b is formed lengthily in a transverse direction to assist in current spreading in the second conductivity type semiconductor layer 27 in the mesa M1. The conductive oxide may have relatively low current spreading performance in the transverse direction compared to the metallic electrode, but the current spreading performance may be compensated by using the current spreader 35b. Moreover, the thickness of the transparent electrode 31 may be reduced by employing the current spreader 35b.

In some implementations, to reduce light absorption by the current spreader 35b, the current spreader 35b is limitedly formed on a partial region of the transparent electrode 31. A total area of the current spreader 35b does not exceed $\frac{1}{10}$ of an area of the transparent electrode 31. The current spreader 35b may include a connection pad region, and may include extensions extending from the connection pad region to both sides. As shown in FIG. 1, the connection pad region may have a relatively wider width than the extensions to assist the connection of the second electrode pad 39b, and the extensions may have a narrower width than the connection pad region.

The extensions may have various shapes for current spreading. As shown in FIG. 1, the extensions may be arranged linearly, but the inventive concepts are not limited thereto.

The connection electrode 35c electrically connects the first light emitting cell C1 and the second light emitting cell C2. For example, one end of the connection electrode 35c may be electrically connected to the first conductivity type semiconductor layer 23 of the first light emitting cell C1, and the other end may be electrically connected to the second conductivity type semiconductor layer 27 of the second light emitting cell C2. As shown in FIG. 1, one end of the connection electrode 35c may be connected to the first conductivity type semiconductor layer 23 of the first light emitting cell C1, and the other end may be connected to the transparent electrode 31 on the second light emitting cell C2. A portion of the connection electrode 35c may be disposed in the indent portion of the mesa M1. In some implementations, as shown in FIG. 2, the other end of the connection electrode 35c may be connected to a portion of the transparent electrode 31 disposed on the lower insulation layer 33.

One end and the other end of the connection electrode 35c may have an elongated shape in the transverse direction. A length of one end in the transverse direction may be longer than a length of the current spreader 35b in the transverse direction, and a length of the other end in the transverse direction may be substantially similar to the length of the current spreader 35b in the transverse direction. In addition, a length of the contact electrode 35a in the transverse direction may be longer than the length of the other end in the transverse direction, and may be substantially similar to the length of the one end in the transverse direction. By setting the lengths of one end and the other end of the connection electrode 35c, the contact electrode 35a, and the current spreader 35b in the transverse direction as above, current spreading in the first and second light emitting cells C1 and C2 is assisted, and thus, the luminous efficiency may be increased.

The connection electrode 35c may be electrically spaced apart from the first conductivity type semiconductor layer 23 of the first light emitting cell C1 by the lower insulation layer 33. The connection electrode 35c is disposed on the lower insulation layer 33 in a boundary region between the first light emitting cell C1 and the second light emitting cell C2. A central portion of the connection electrode 35c connecting the one end and the other end may have a narrower width than the lengths of the one end and the other end, and thus, the width of the insulation layer 33 insulating the connection electrode 35c from the light emitting cells C1 and C2 may be reduced. Accordingly, light loss caused by the lower insulation layer 33 and the connection electrode 35c may be reduced. Furthermore, the connection electrode 35c may be formed to have at least two current paths between the first light emitting cell C1 and the second light emitting cell C2, and thus, it is possible to reduce an actual area of the connection electrode 35c, thereby further reducing light loss. For example, as shown in FIG. 1, the connection electrode 35c may have an opening 35h exposing the lower insulation layer 33 in a central region. A size of the opening 35h may be determined considering the current path and light loss avoidance, and in an embodiment, as shown in FIG. 1, it may have a larger width than a width of the current path.

The contact electrode 35a, the current spreader 35b, and the connection electrode 35c may be formed together using a same material in a same process, and thus, may have a same layer structure as one another. For example, the contact electrode 35a, the current spreader 35b, and the connection electrode 35c may include an Al reflection layer, and may include an Au connection layer. Specifically, the contact electrode 35a and the current spreader 35b may have a layer structure of Cr/Al/Ti/Ni/Ti/Ni/Au/Ti. Thicknesses of the contact electrode 35a, the current spreader 35b, and the connection electrode 35c may be similar to or greater than the thickness of the mesa M, and thus, an upper surface of the contact electrode 35a may be positioned substantially similar to or higher than an upper surface of the mesa M. For example, the thickness of the mesa M may be approximately 1.5 um, and the thicknesses of the contact electrode and the current spreaders 33 and 35 may be approximately 1.5 um to 2 um.

The first insulation reflection layer 37 covers the substrate 21, the first light emitting cell C1, the second light emitting cell C2, the transparent electrode 31, the lower insulation layer 33, the contact electrode 35$a$, the current spreader 35$b$, and the connection electrode 35$c$. The first insulation reflection layer 37 covers upper regions and the side surfaces of the mesas M1 and M2 and also covers the first conductivity type semiconductor layer 23 exposed around the mesas M1 and M2 and the side surfaces of the first conductivity type semiconductor layer 23. The first insulation reflection layer 37 also covers the upper surface of the substrate 21 exposed around the first conductivity type semiconductor layer 23. The first insulation reflection layer 37 also covers a region between the contact electrode 35$a$ and the mesa M2 and a region between the connection electrode 35$c$ and the mesa M1.

In some implementations, the first insulation reflection layer 37 has openings 37$a$ and 37$b$ exposing the contact electrode 35$a$ and the current spreader 35$b$. The openings 37$a$ and 37$b$ have a size smaller than the area of the contact electrode 35$a$ and the current spreader 35$b$, respectively, and are limitedly positioned on the contact electrode 35$a$ and the current spreader 35$b$.

The first insulation reflection layer 37 includes a distributed Bragg reflector. The distributed Bragg reflector may be formed by repeatedly stacking dielectric layers having different refractive indices from one another, the dielectric layers may include $TiO_2$, $SiO_2$, $HfO_2$, $ZrO_2$, $Nb_2O_5$, $MgF_2$, or the like. For example, the first insulation reflection layers 37 may have a structure of alternately stacked $TiO_2$ layer/ $SiO_2$. The distributed Bragg reflector is manufactured to reflect light generated in the active layer 25, and formed in a plurality of pairs to improve reflectance. In this embodiment, the distributed Bragg reflector may include 10 to 25 pairs. The first insulation reflection layer 37 may include an additional insulation layer together with the distributed Bragg reflector, and for example, may include an interface layer positioned under the distributed Bragg reflector to improve adhesion between the distributed Bragg reflector and an underlying layer thereof and a protection layer covering the distributed Bragg reflector. The interface layer may be formed of, for example, a $SiO_2$ layer, and the protection layer may be formed of $SiO_2$ or $SiN_x$.

The first insulation reflection layer 37 may have a thickness of about 2 um to about 5um. The distributed Bragg reflector may have reflectance of 90% or more for light generated in the active layer 25, and reflectance close to 100% may be provided by controlling types, thicknesses, and stacking frequencies of a plurality of dielectric layers forming the distributed Bragg reflector. Moreover, the distributed Bragg reflector may have a high reflectance for other visible light besides light generated in the active layer 25.

For example, the first insulation reflection layer 37 may include a shorter wavelength DBR suitable for reflecting shorter wavelength (e.g., 400 nm) visible light generated in the active layer 25 and a longer wavelength DBR suitable for reflecting longer wavelength (e.g., 700 nm) visible light converted by a wavelength converter such as a phosphor. By using the longer wavelength DBR and the shorter wavelength DBR, a reflection band may be widened, and furthermore, even light incident to the first insulation reflection layer 37 at an inclination angle may be reflected with a high reflectance. In this embodiment, the longer wavelength DBR may be disposed closer to the light emitting structure 30 than the shorter wavelength DBR, but the opposite may also be true.

In an embodiment, the DBR structure of the first insulation reflection layer 37 may be distinctly divided into a first region, a second region, and a third region, in which the first region is disposed closer to the light emitting structure 30 than the second region, and the third region is disposed between the first region and the second region.

First Region

The first region is provided to increase reflectance near a central wavelength k and in a spectral region with a wavelength (e.g., 700 nm) longer than the central wavelength. Accordingly, optical thicknesses of first material layers and second material layers of the first region are approximately near $0.25\lambda$ or greater than $0.25\lambda$.

Specifically, in the first region, the first material layers ($SiO_2$ layers) are divided into a first group of first material layers having optical thicknesses greater than $0.25\lambda+10\%$, and a second group of first material layers having optical thicknesses less than $0.25\lambda+10\%$ and greater than $0.25\lambda-10\%$. These first group of first material layers and second group of first material layers are alternately disposed with each other. The first group of first material layers having relatively large thicknesses and the second group of first material layers having relatively small thicknesses are alternately disposed with each other. A first material layer of the first group may be formed first, without being limited thereto, or a first material layer of the second group may be formed first.

Further, the first group of first material layers generally have the optical thicknesses less than $0.3\lambda+10\%$.

In some implementations, the second material layers (e.g., $TiO_2$ layers) in the first region include a first group of second material layers having optical thicknesses greater than $0.25\lambda+10\%$ and a second group of second material layers having optical thicknesses greater than $0.25\lambda-10\%$ and less than $0.25\lambda+10\%$.

The first group of second material layers and the second group of second material layers are also clearly differentiated in optical thickness. Further, most of these first group of second material layers and second group of second material layers are alternately disposed with each other.

In some implementations, the first group of second material layers generally have smaller optical thicknesses than those of the first group of first material layers. Further, an average value of the optical thicknesses of the first group of second material layers is smaller than an average value of the optical thicknesses of the first group of first material layers. Since the second material layers having a relatively high refractive index have higher light absorption than the first material layers having a relatively low refractive index, light loss may be reduced by forming the first group of second material layers to be relatively thin.

The first group of second material layers may have the optical thicknesses less than $0.25\lambda+20\%$ (i.e., $0.3\lambda$). On the contrary, the first group of first material layers generally have the optical thicknesses greater than $0.25\lambda+20\%$.

In some implementations, although the second group of second material layers may also have optical thicknesses smaller than those of the second group of first material layers to prevent light loss, since the second group of second material layers has a relatively smaller optical thickness than that of the first group of second material layers, reduction in thickness of the second group of second material layers does not provide a substantial effect in reduction of light loss. Accordingly, the second group of second material layers and the second group of first material layers may have substantially similar optical thicknesses.

Second Region

The second region is provided to increase reflectance in a spectral region having a shorter wavelength (e.g., 400 nm) than the central wavelength λ. Accordingly, the optical thicknesses of the first material layers and the second material layers of the second region are generally smaller than 0.25λ.

Specifically, the second region includes a third group of first material layers having optical thicknesses smaller than 0.25λ–10% and consecutively arranged. Further, the third group of first material layers have the optical thicknesses greater than 0.2λ–10%.

An optical thickness deviation of the first material layers in the second region is less than an optical thickness deviation of the first material layers in the first region. Since the first group of first material layers and the second group of first material layers in the first region have the optical thicknesses that are distinctly different from each other, their thickness deviation becomes relatively large relative to the first material layers in the second region having generally similar optical thicknesses.

In some implementations, the second material layers in the second region include a third group of second material layers having optical thicknesses smaller than 0.25λ–10% and consecutively arranged. In the second region, only a first second material layer (i.e., a second material layer of a 13th pair) has an optical thickness greater than 0.25λ–10%, and all other second material layers have optical thicknesses smaller than 0.25λ–10%.

Third Region

The third region is disposed between the first region and the second region, and disposed to remove a ripple generated when DBRs having different reflection bands overlap one another.

The third region generally consists of a small number of pairs. In this embodiment, the first region consists of a largest number of pairs, and the third region consists of a smallest number of pairs.

Specifically, the third region includes a first material layer having an optical thickness less than 0.25λ–10%, and a first material layer having an optical thickness greater than 0.25λ. Further, the third region may include a first material layer having an optical thickness greater than 0.25λ-10% and less than 0.25λ.

In addition, second material layers in the third region may include a second material layer having an optical thickness of less than 0.25λ–10%, and a second material layer having an optical thickness of greater than 0.25λ and less than 0.25λ+10%. Furthermore, the second material layers in the third region may further include a second material layer having an optical thickness greater than 0.25λ+10%.

In the third region consisting of a relatively small number of pairs, the first material layers and the second material layers are configured to have relatively various optical thicknesses compared to the material layers in the first region and the second region.

According to this embodiment, the first and second material layers of the first region disposed relatively close to the light emitting structure 30 and reflecting light in a longer wavelength range are divided into the first group having relatively higher optical thicknesses and the second group having relatively smaller optical thicknesses, thereby enabling removal of ripples generated in a stop band as an incident angle increases.

In addition, it will be advantageous that the number of pairs in the first region is greater than the number of pairs in other regions to enhance the reflectance of the longer wavelength range.

In some implementations, the first pad electrode 39a and the second pad electrode 39b are positioned on the first insulation reflection layer 37, and connected to the contact electrode 35a and the current spreader 35b through openings 37a and 37b, respectively.

As shown in FIG. 1, the first pad electrode 39a is generally positioned in an upper region of the transparent electrode 31 on the mesa M2, and a portion thereof is positioned on the contact electrode 35a. In addition, the first pad electrode 39a is spaced apart from the connection electrode 35c in the transverse direction not to overlap the connection electrode 35c. Since the first pad electrode 39a does not overlap the connection electrode 35c, even when a crack occurs in the first insulation reflection layer 37, it is possible to prevent an electrical short circuit between the first pad electrode 39a and the connection electrode 35c from occurring.

In some implementations, the second pad electrode 39b is positioned in an upper region of the transparent electrode 31 on the mesa M1, and connected to the connection pad region of the current spreader 35b through the opening 37b. As shown in the drawings, the second pad electrode 39b may overlap the current spreader 35b. In some implementations, the second pad electrode 39b is spaced apart from the connection electrode 35c in the transverse direction not to overlap the connection electrode 35c. In particular, the second pad electrode 39b is disposed within an upper region of the mesa M1, and does not extend to a region between the mesa M1 and the connection electrode 35c.

The first pad electrode 39a and the second pad electrode 39b may be formed together of a same material in a same process, and thus, may have a same layer structure. Thicknesses of the first and second pad electrodes 39a and 39b may be smaller than that of the first insulation reflection layer 37, for example, about 2 um.

The second insulation reflection layer 41 is disposed under the substrate 21. The second insulation reflection layer 41 may cover an entire lower surface of the substrate 21. The second insulation reflection layer 41 includes a distributed Bragg reflector. The second insulation reflection layer 41 may further include an interface layer positioned between the distributed Bragg reflector and the substrate 21, and may further include a protection layer covering the distributed Bragg reflector. The interface layer may be formed of, for example, SiO₂, and the protection layer may be formed of SiO₂ or SiNₓ.

The distributed Bragg reflector of the second insulation reflection layer 41 may be formed to have various reflectances depending on the use. In an embodiment, the second insulation reflection layer 41 may have a structure similar to that of the distributed Bragg reflector of the first insulation reflection layer 37 to have a high reflectance, and may be designed in consideration of the reflectance depending on the incident angle. Since the second insulation reflection layer 41 has a high reflectance, most of light may be emitted through a side surface of the light emitting diode 100. The second insulation reflection layer 41 may include a longer wavelength DBR and a shorter wavelength DBR similarly to the first insulation reflection layer 37, except that positions of the longer wavelength DBR and the shorter wavelength DBR in the distributed Bragg reflector of the first insulation reflection layer 37 and positions of the longer wavelength DBR and the shorter wavelength DBR in the distributed Bragg reflector of the second insulation reflection layer 41 are closely related to each other, and may be disposed to be mirror symmetrical to each other with the substrate 21 interposed therebetween.

In another embodiment, the distributed Bragg reflector of the second insulation reflection layer 41 may be formed to have the reflectance of about 40% to about 90%. For example, the second insulation reflection layer 41 may be formed of 15 or less insulation layers, so that reflectance for normal incidence may be 90% or less, more preferably 70% or less, or furthermore 50% or less. By setting the reflectance of the second insulation reflection layer 41 to 90% or less, light may be emitted even through the second insulation reflection layer 41.

Figure 3A:
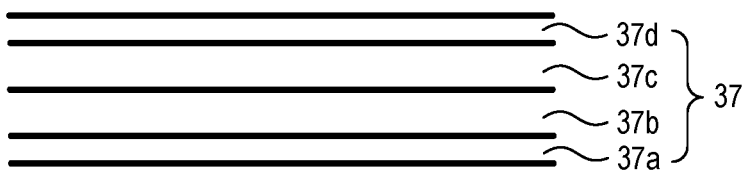
FIGS. 3A and 3B are schematic cross-sectional views illustrating a relative positional relationship between a first insulation reflection layer and a second insulation reflection layer according to embodiments of the present disclosure.
Figure 3A:
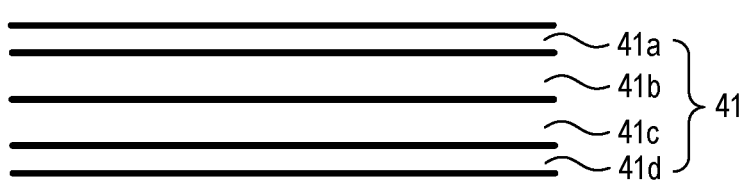
Figure 3B:
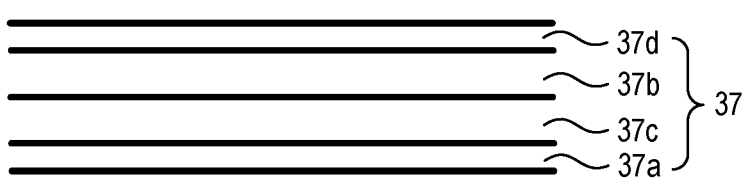
Figure 3B:
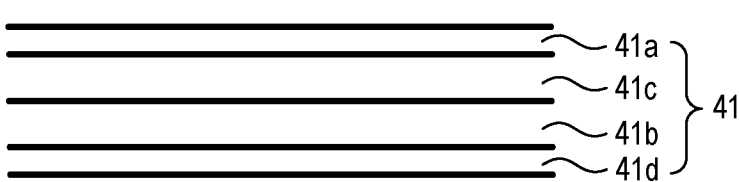

FIGS. 3A and 3B are schematic cross-sectional views illustrating a relative positional relationship between the first insulation reflection layer 37 and the second insulation reflection layer 41 according to an embodiment.

Referring to FIGS. 3A and 3B, the first insulation reflection layer 37 and the second insulation reflection layer 41 may include interface layers 37a and 41a, longer wavelength DBRs 37b and 41b, shorter wavelength DBRs 37c and 41c, and protection layers 37d and 41d, respectively. The longer wavelength DBRs 37b and 41b may be formed of the above-described first region, and the shorter wavelength DBRs 37c and 41c may be formed of the above-described second region. In addition, although not shown in the drawings, a third region may be disposed between the first region and the second region.

In the embodiment of FIG. 3A, the longer wavelength DBRs 37b and 41b of the first and second insulation reflection layers 37 and 41 are disposed closer to the substrate 21 than the shorter wavelength DBRs 37c and 41c.

In the embodiment of FIG. 3B, the shorter wavelength DBRs 37c and 41c of the first and second insulation reflection layers 37 and 41 are disposed closer to the substrate 21 than the longer wavelength DBRs 37b and 41b.

As shown in FIGS. 3A and 3B, the longer wavelength DBR 37b and shorter wavelength DBR 37c of the first insulation reflection layer 37 and the longer wavelength DBR 41b and shorter wavelength DBR 41c of the second insulation reflection layer 41 are disposed symmetrical to each other with the substrate 21 interposed therebetween, and thus, light extraction efficiency through the side surface of the substrate 21 may be improved.

In some implementations, the second insulation reflection layer 41 may be formed on the lower surface of the substrate 21 after the first and second pad electrodes 39a and 39b are formed. Subsequently, a light emitting diode is provided by dividing the second insulation reflection layer 41, the substrate 21, and the first insulation reflection layer 37 through a dicing process.

The second insulation reflection layer 41 assists to extract light sidewards of the substrate 21 by reflecting light emitted through the lower surface of the substrate 21. Accordingly, a viewing angle of the light emitting diode is increased.

Figure 4A:
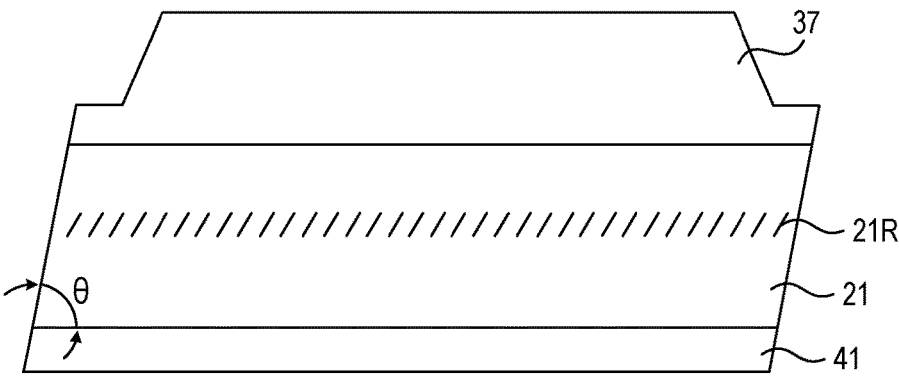
FIGS. 4A and 4B are schematic side views illustrating an inclination of a side surface of a substrate.
Figure 4B:
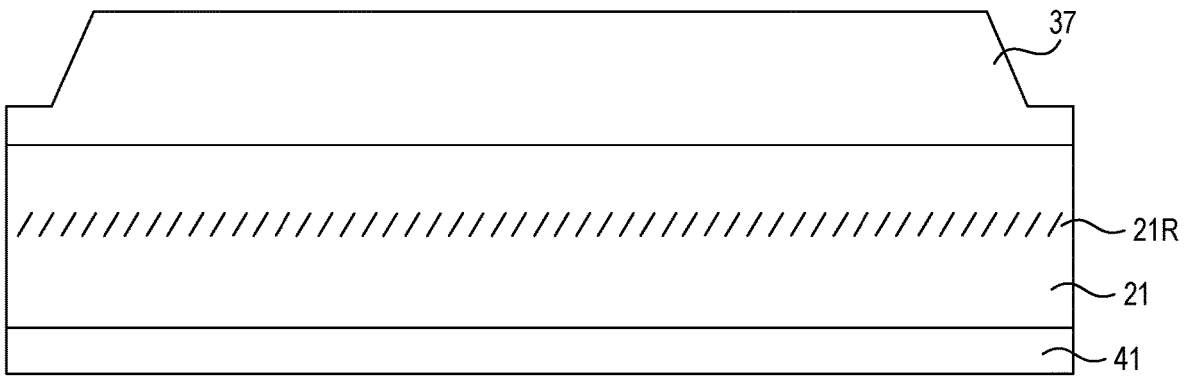

In some implementations, the substrate 21 of the light emitting diode has a rectangular shape in plan view, and portions of the side surfaces may be inclined with respect to the lower surface of the substrate. FIGS. 4A and 4B are schematic side views illustrating an inclination of the substrate 21, FIG. 4A is a side view showing a transverse plane, FIG. 4B is a side view showing a longitudinal plane, and FIGS. 5A and 5 are images showing the transverse plane and the longitudinal plane of the substrate 21.

Figure 5A:
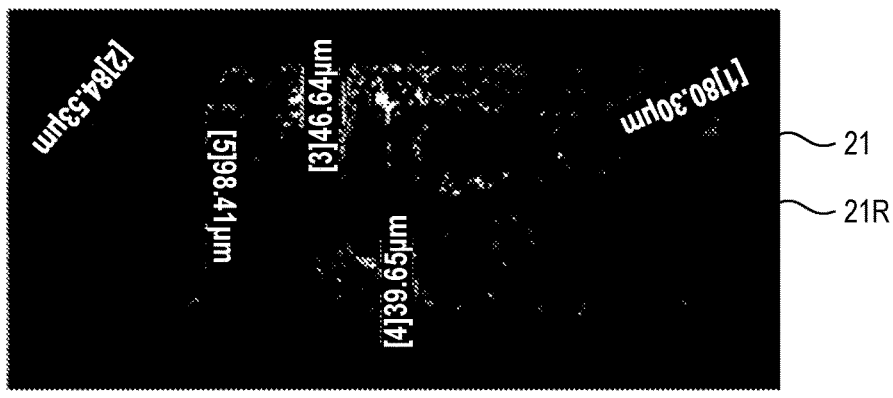
FIGS. 5A and 5B are side images showing an inclination of a side surface of a substrate.

Referring to FIGS. 4A and 5A, both edges of the transverse plane parallel to a transverse edge of the substrate 21 are inclined with respect to the lower surface of the substrate 21. That is, the longitudinal planes of the substrate 21 are inclined with respect to the lower surface of the substrate 21. An inclination angle θ formed by the longitudinal plane of the substrate 21 with respect to the lower surface of the substrate 21 may be within a range of about 80 degrees to about 85 degrees.

Figure 5B:
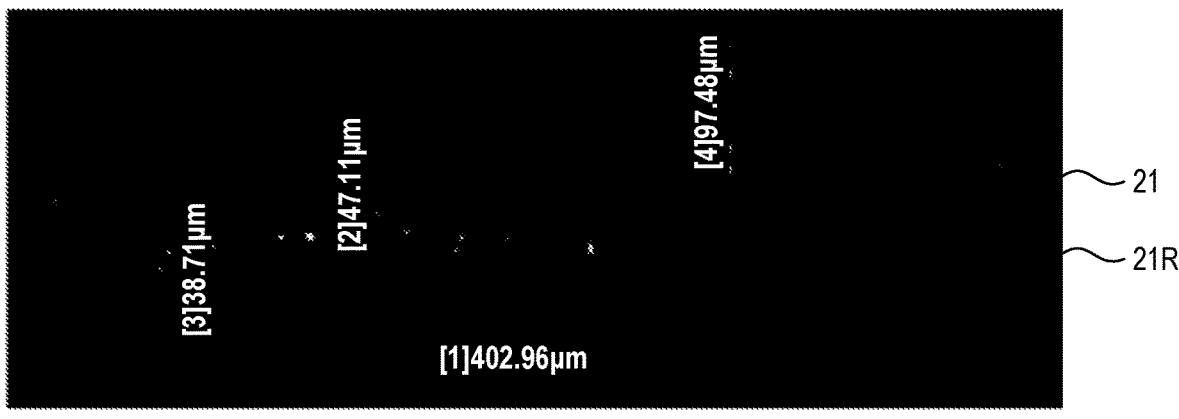

Referring to FIGS. 4B and 5B, both edges of the longitudinal plane parallel to a longitudinal edge of the substrate 21 are perpendicular to the lower surface of the substrate 21. That is, the transverse planes of the substrate 21 are perpendicular to the lower surface of the substrate 21.

In another embodiment, the longitudinal planes may be perpendicular with respect to the lower surface of the substrate 21, and the transverse planes may be inclined with respect to the lower surface of the substrate 21.

In some implementations, as it can be seen in FIGS. 5A and 5B, a roughened surface 21R is formed along the side surfaces of the substrate 21. The roughened surface 21R is formed on each of side surfaces along a periphery of the substrate 21 near a central portion of the substrate 21.

Figure 6:
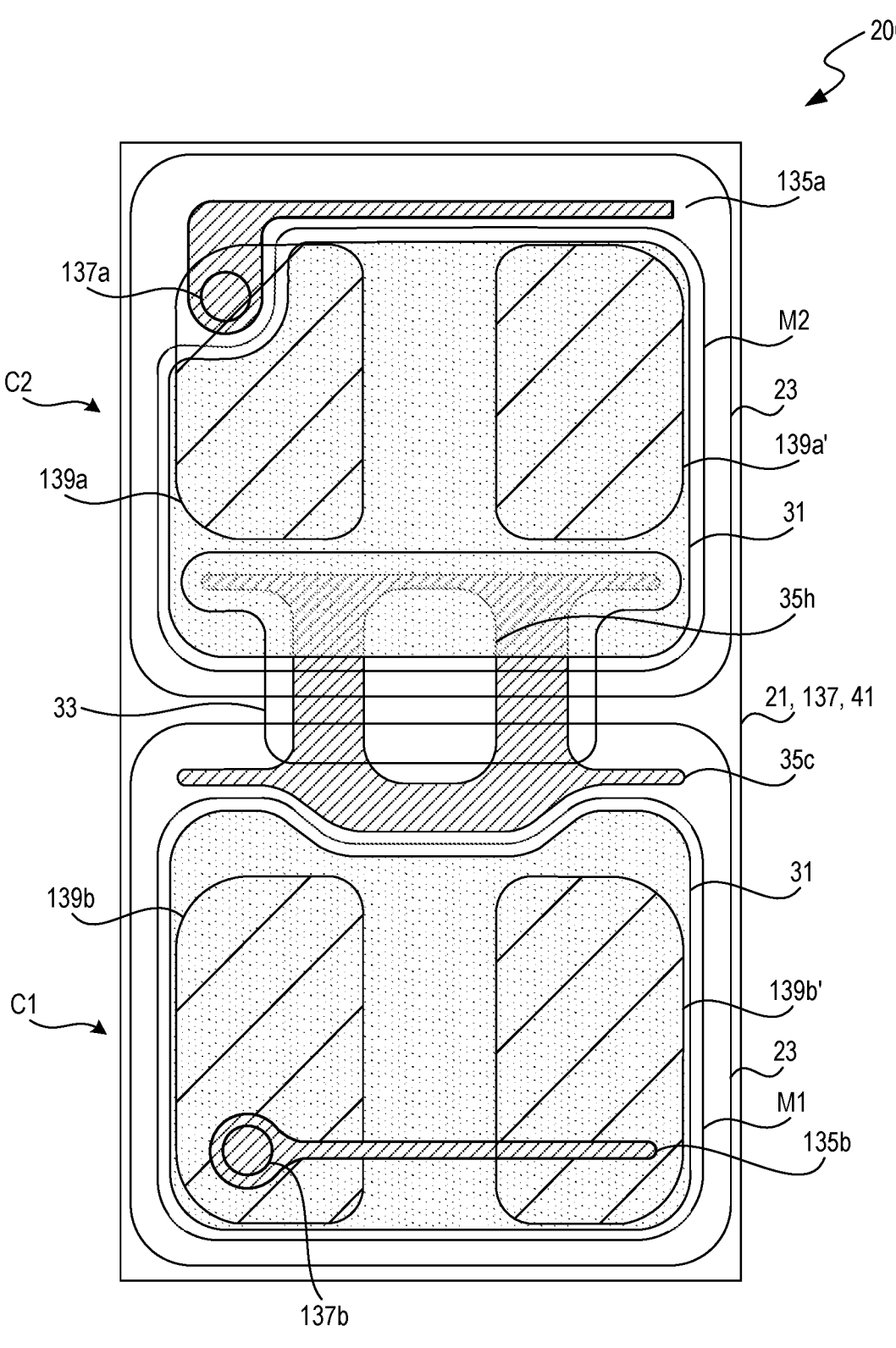
FIG. 6 is a schematic plan view illustrating a light emitting diode according to another embodiment of the present disclosure.

FIG. 6 is a schematic plan view illustrating a light emitting diode 200 according to another embodiment of the present disclosure.

Referring to FIG. 6, the light emitting diode 200 according to this embodiment is substantially similar to the light emitting diode 100 described with reference to FIGS. 1 and 2, except that first electrode pads 139a and 139a' and second electrode pads 139b and 139b' of the light emitting diode 200 of this embodiment are separated into two portions, respectively, whereas each of the first electrode pad 39a and the second electrode pads 39b of the light emitting diode 100 is formed as a single region. In addition, shapes of a contact electrode 135a and a current spreader 135b and positions of connection pad regions are changed according to positions of the first electrode pad 139a and the second electrode pad 139b.

First, a shape of the mesa M2 may be changed. In a case of the light emitting diode 100, an indent portion is formed near a center of one side edge of the mesa M2 and the connection pad region of the contact electrode 35a is disposed in the indent portion, but in this embodiment, an indent portion may be disposed close to the corner of the mesa M2, or as shown in FIG. 6, the corner of the mesa M2 may be recessed instead of the indent portion.

The connection pad region of the contact electrode 135a is disposed in a recessed region of the mesa M2, and may laterally extend from the connection pad region along the edge of the mesa M2.

In some implementations, the current spreader 135b may have a connection pad region near a corner of the mesa M1, and may laterally extend from the connection pad region.

A first insulation reflection layer 137 has an opening 137a exposing the contact electrode 135a in the recessed region of the mesa M2, and has an opening 137b exposing the connection pad region of the current spreader 135b in the upper region of the mesa M1.

In some implementations, the first electrode pads 139a and 139a' and the second electrode pads 139b and 139b' are disposed on the first insulation reflection layer 137. The first electrode pad 139a is connected to the contact electrode 135a through the opening 137a, and the second electrode pad 139b is connected to the current spreader 135b through the opening 137b.

In some implementations, the first electrode pad 139a' is disposed in the upper region of the mesa M2, and spaced apart from the first electrode pad 139a. The first electrode pad 139*a*' may be formed of a same material as that of the first electrode pad 139*a* in a same process. In some implementations, the second electrode pad 139*b*' is disposed in the upper region of the mesa M1, and spaced apart from the second electrode pad 139*b*. The second electrode pad 139*b*' may be formed of a same material as that of the second electrode pad 139*b* in a same process.

In the above embodiment, light emitting diodes according to various embodiments of the present disclosure have been described, but the inventive concepts are not limited thereto. The light emitting diode may be applied to various electronic apparatuses requiring a small light emitting unit, and may be applied to, for example, a display apparatus or a lighting apparatus.

Hereinafter, a distributed Bragg reflector will be described in detail. The distributed Bragg reflector described herein may be applied to all of the first insulation reflection layers 137 and the second insulation reflection layer 41 unless otherwise specified.

Figure 7:
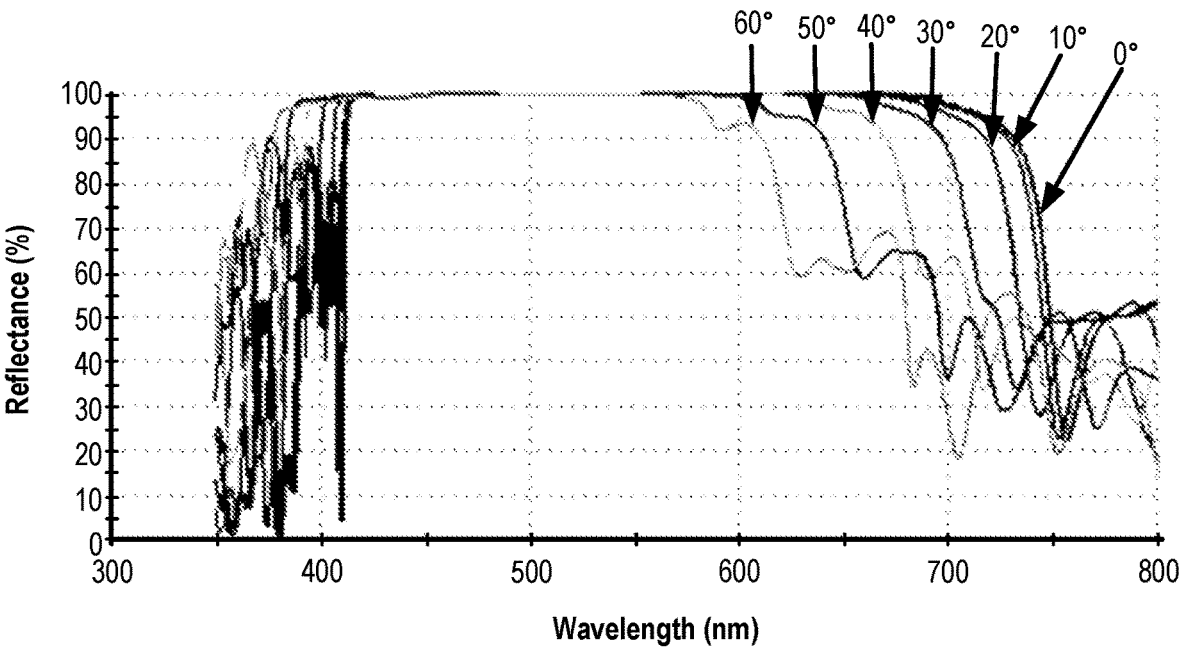
FIG. 7 is a graph showing reflectance according to an incident angle of a distributed Bragg reflector according to a first embodiment.

FIG. 7 is a graph showing reflectance according to an incident angle of a distributed Bragg reflector according to a first embodiment.

The distributed Bragg reflector according to the first embodiment was formed in 12 pairs by alternately stacking $SiO_2$ and $TiO_2$, and a thickness of each layer is summarized in Table 1.

TABLE 1

| Material | Thickness (nm) |
|---|---|
| $SiO_2$ | 120 |
| $TiO_2$ | 53.67 |
| $SiO_2$ | 45.96 |
| $TiO_2$ | 45.6 |
| $SiO_2$ | 84.57 |
| $TiO_2$ | 37.51 |
| $SiO_2$ | 76.36 |
| $TiO_2$ | 45.5 |
| $SiO_2$ | 87.3 |
| $TiO_2$ | 45.12 |
| $SiO_2$ | 80.68 |
| $TiO_2$ | 44.97 |
| $SiO_2$ | 77.33 |
| $TiO_2$ | 42.77 |
| $SiO_2$ | 82.62 |
| $TiO_2$ | 74.57 |
| $SiO_2$ | 125.12 |
| $TiO_2$ | 69.6 |
| $SiO_2$ | 74.78 |
| $TiO_2$ | 73.42 |
| $SiO_2$ | 96.88 |
| $TiO_2$ | 47.48 |
| $SiO_2$ | 150 |
| $TiO_2$ | 76.71 |
| $SiO_2$ | 85 |
| Substrate | |

Referring to FIG. 7, a reflector according to the first embodiment exhibits high reflectance over a wide wavelength range of visible light. For light incident in a direction perpendicular to the reflector, that is, at an incident angle of 0 degree, the distributed Bragg reflector according to the first embodiment exhibits the reflectance of about 95% or more within a range of about 410 nm to about 700 nm, and furthermore, exhibits the reflectance of about 98% or more within a range of about 410 nm to about 690 nm. In some implementations, as the incident angle increases, a reflection band shifts to a shorter wavelength side. Light incident in the direction perpendicular to the reflector (0 degree) exhibits high reflectance even at about 700 nm, but as the incident angle increases, a region showing high reflectance moves to the shorter wavelength side, and the reflectance decreases near 700 nm. However, it can be seen that the distributed Bragg reflector according to the first embodiment exhibits the reflectance of about 100% for a wavelength of about 550 nm even at an incident angle of 60 degrees.

The reflector according to the first embodiment may be applied to all of the first insulation reflection layers 37 and 137 and the second insulation reflection layer 41. In particular, since light generated in the light emitting diode 100 generally has a peak wavelength of about 500 nm or less, the reflector can be more suitably used for the first insulation reflection layers 37 and 137 requiring high reflectance at all incident angles. In some implementations, when the reflector according to the first embodiment is applied to the second insulation reflection layer 41, the second insulation reflection layer 41 may reflect almost all of blue or ultraviolet light generated in the light emitting diode 100, and thus, the light emitting diode 100 emits light sidewards.

Figure 8:
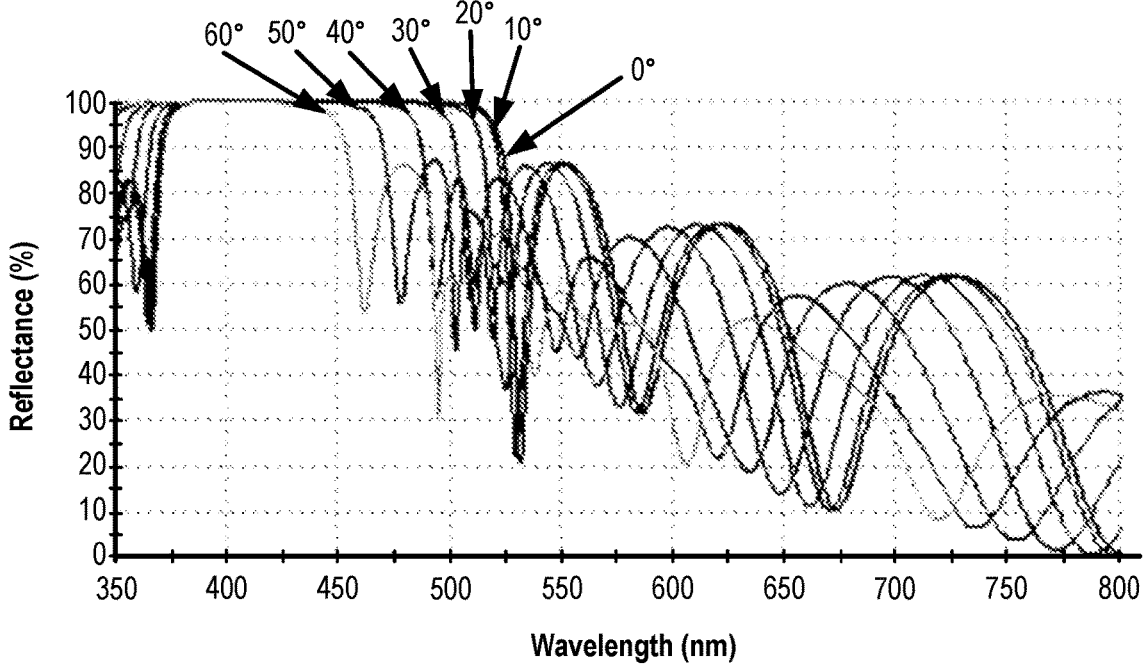
FIG. 8 is a graph showing reflectance according to an incident angle of a distributed Bragg reflector according to a second embodiment.

FIG. 8 is a graph showing reflectance according to an incident angle of a distributed Bragg reflector according to a second embodiment.

The distributed Bragg reflector according to the second embodiment was formed in 10 pairs by alternately stacking $SiO_2$ and $TiO_2$, and a thickness of each layer is summarized in Table 2.

TABLE 2

| Material | Thickness (nm) |
|---|---|
| $SiO_2$ | 70.26 |
| $TiO_2$ | 56.22 |
| $SiO_2$ | 61.61 |
| $TiO_2$ | 47.69 |
| $SiO_2$ | 61.72 |
| $TiO_2$ | 46.37 |
| $SiO_2$ | 72.22 |
| $TiO_2$ | 49.08 |
| $SiO_2$ | 63.1 |
| $TiO_2$ | 44.52 |
| $SiO_2$ | 73.82 |
| $TiO_2$ | 39.34 |
| $SiO_2$ | 76.97 |
| $TiO_2$ | 37.76 |
| $SiO_2$ | 79.88 |
| $TiO_2$ | 37.78 |
| $SiO_2$ | 80.25 |
| $TiO_2$ | 76.75 |
| $SiO_2$ | 85.61 |
| $TiO_2$ | 51.01 |
| Substrate | |

Referring to FIG. 8, a reflector according to the second embodiment exhibits high reflectance over a relatively narrow wavelength range of visible light. The distributed Bragg reflector according to the second embodiment exhibits the reflectance of about 95% or more within a range of about 375 nm to about 520 nm. Moreover, it exhibits the reflectance of about 98% or more within a range of about 380 nm to about 500 nm. As an incident angle increases, a reflection band shifts toward a shorter wavelength. Light incident in a direction perpendicular to the reflector (0 degree) exhibits high reflectance even at about 500 nm, but as the incident angle increases, a region showing high reflectance moves to a shorter wavelength side, and the reflectance decreases around 500 nm. When the incident angle is 60 degrees, it can be seen that the reflectance is lowered to about 90% even at a wavelength of light emitted from the light emitting diode, for example, near 455 nm.

The reflector according to the second embodiment may be applied to all of the first insulation reflection layers 37 and 137 and the second insulation reflection layer 41. However, it may be more suitably used for the second insulation reflection layer 41 rather than the first insulation reflection layers 37 and 137 requiring high reflectance for all incident angles. Particularly, by applying the reflector according to the second embodiment to the second insulation reflection layer 41, a portion of light generated in the light emitting diode 100 may be transmitted through the second insulation reflection layer 41.

In an embodiment, the distributed Bragg reflector of the first embodiment having the reflection band having the high reflectance over almost an entire visible region may be applied to the first insulation reflection layers 37 and 137, and the distributed Bragg reflector of the second embodiment having the reflection band having the high reflectance in some regions of the visible region may be applied to the second insulation reflection layer 41.

The thicknesses of each layer in the distributed Bragg reflector shown in Tables 1 and 2 are specific examples for providing the distributed Bragg reflector having the high reflectance in a specific wavelength band, and the present disclosure is not limited to the thicknesses of these layers. The thicknesses of each layer may be designed in various ways according to a desired reflection band. In particular, the distributed Bragg reflector according to the second embodiment may be designed to have a low reflectance at a desired incidence angle. The incidence angle exhibiting low reflectance may be variously changed depending on a product. To control the reflectance of light emitted from the light emitting diode according to the incident angle, the distributed Bragg reflector according to the second embodiment exhibits its low reflectance for longer wavelength visible light. Due to this, light converted into the longer wavelength from the outside of the light emitting diode may be re-incident to the inside of the light emitting diode 100. Re-incident light may be reflected by the first insulation reflection layers 37 and 137 and emitted to the outside, but light may be lost while re-emitted after being incident into the light emitting diode. To reduce the loss of light, it is necessary to reduce the incidence of wavelength-converted light into the light emitting diode. In some implementations, second and third reflection bands exhibiting relatively high reflectance in a region other than the reflection band of the distributed Bragg reflector may be matched to a peak wavelength of the wavelength-converted light. For example, in the reflectance graph shown in FIG. 8, the second reflection band has a highest reflectance within a range of 500 nm to 600 nm, and the third reflection band has a highest reflectance within a range of about 600 nm to about 650 nm. Accordingly, light wavelength-converted by a green phosphor and a red phosphor may be reflected by the second insulation reflection layer 41, and thus, an amount of light re-incident into the light emitting diode 100 may be reduced. The reflectance of the second insulation reflection layer 41 in a range of about 550 nm to about 700 nm may be lower than the reflectance of the first insulation reflection layers 37 and 137 in a same wavelength range.

Figure 9:
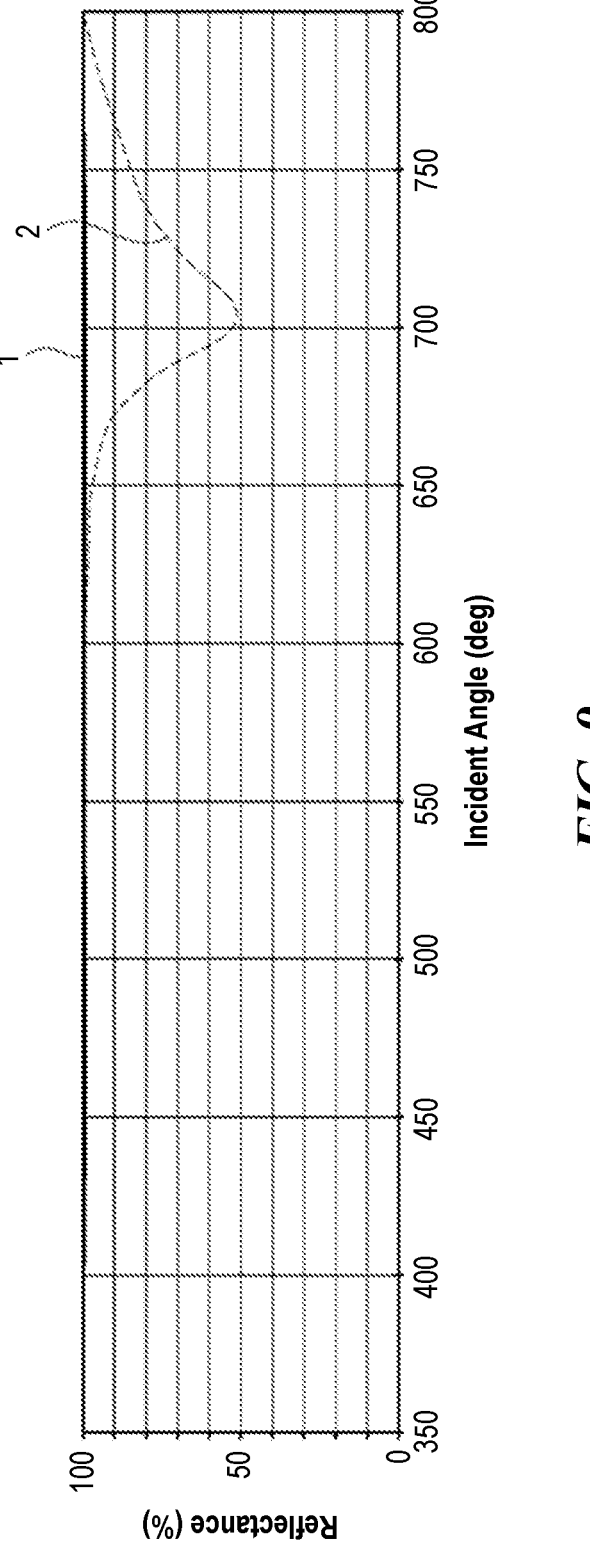
FIG. 9 is a graph showing reflectance according to the incident angles of the distributed Bragg reflectors of the first and second embodiments at emission wavelengths of a light emitting diode.

FIG. 9 is a graph showing reflectances according to the incident angles of the distributed Bragg reflectors of the first and second embodiments at emission wavelengths of a light emitting diode.

Referring to FIG. 9, the distributed Bragg reflector of the second embodiment may have an incident angle region having reflectance lower than that of the distributed Bragg reflector of the first embodiment. For example, the distributed Bragg reflector of the first embodiment exhibits nearly 100% reflectance for light having a peak wavelength of about 455 nm emitted from the light emitting diode 100 over all incident angles within a range of 0 degrees to 90 degrees. On the contrary, the distributed Bragg reflector of the second embodiment exhibits the reflectance of about 50% near an incident angle of about 70 degrees. Accordingly, by employing the distributed Bragg reflector according to the second embodiment as the second insulation reflection layer 41, a portion of light incident at the incident angle of 70 degrees may be emitted to the outside through the second insulation reflection layer 41.

Figure 10:
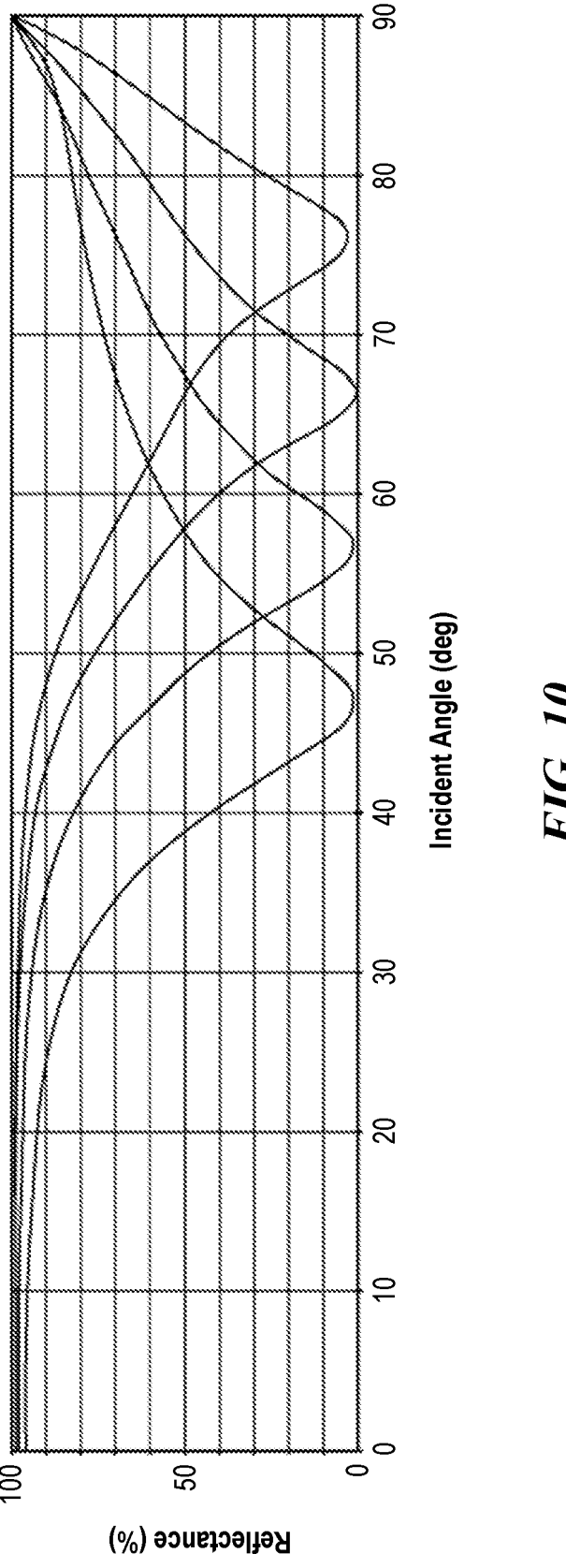
FIG. 10 is a graph showing reflectance at emission wavelengths of a light emitting diode according to various embodiments of the present disclosure.

FIG. 10 is a graph showing reflectance at emission wavelengths of the light emitting diode according to various embodiments of the present disclosure.

Although the distributed Bragg reflector exhibiting the reflectance of about 50% at the incident angle of about 70 degrees has been described above, a lowest reflectance and an incident angle exhibiting the lowest reflectance may be variously modified. As shown in FIG. 10, the lowest reflectance may be about 0%, and the incidence angle showing the lowest reflectance may also be variously modified. The distributed Bragg reflector has a higher reflectance at the incident angle of 0°, but a distributed Bragg reflector having a lower reflectance at the incident angle of 0° may be provided.

Figure 11:
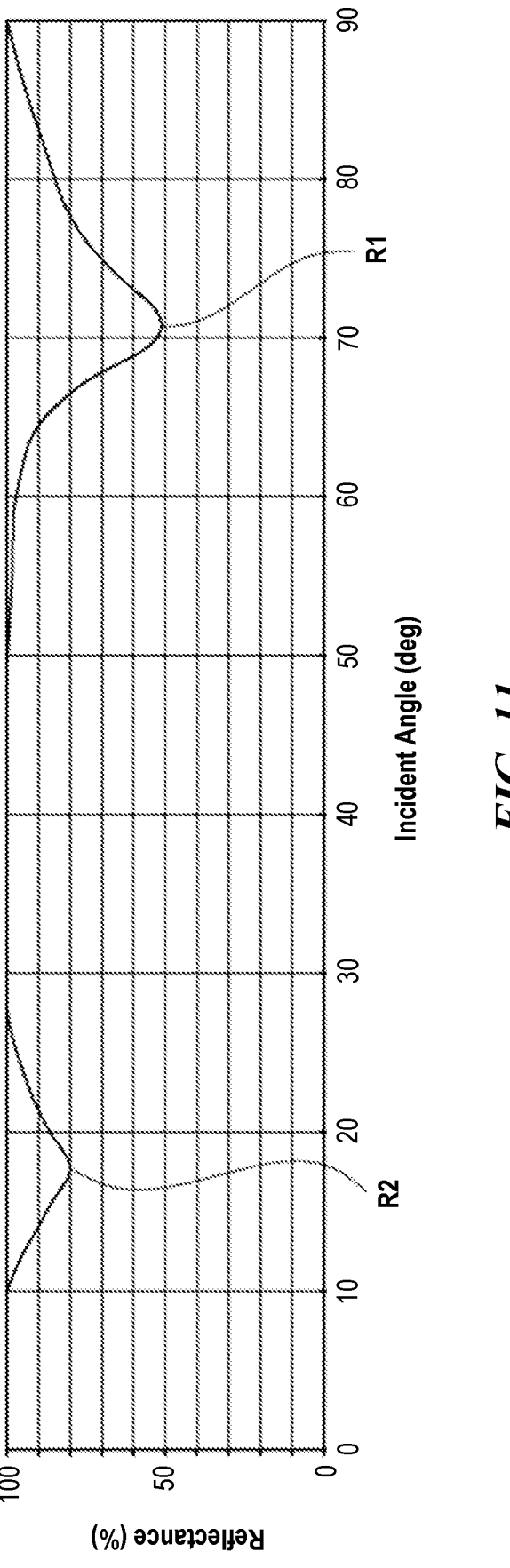
FIG. 11 is a graph showing reflectance at emission wavelengths of a light emitting diode according to another embodiment of the present disclosure.

FIG. 11 is a graph showing reflectance at emission wavelengths of the light emitting diode according to another embodiment of the present disclosure.

Although embodiments in which the incidence angle exhibiting the lowest reflectance is one are illustrated and described above, as shown in FIG. 11, a distributed Bragg reflector having a plurality of local minimum reflectances may be designed. For example, the distributed Bragg reflector may have a first reflectance R1 that is a local minimum reflectance at a first incident angle of 45 degrees or more, and may have a second reflectance R2 that is a local minimum reflectance at a second incident angle of less than 45 degrees. As shown in FIG. 11, the second reflectance R2 may be higher than the first reflectance R1. However, the inventive concepts are not limited thereto, and the second reflectance R2 may be lower than the first reflectance R1. By setting to have the first reflectance R1 and the second reflectance R2 at various incident angles, an amount of light passing through the distributed Bragg reflector may be adjusted, and accordingly, a deviation of light amounts between the upper surface and side surfaces of the light emitting diode may be adjusted.

Figure 12A:
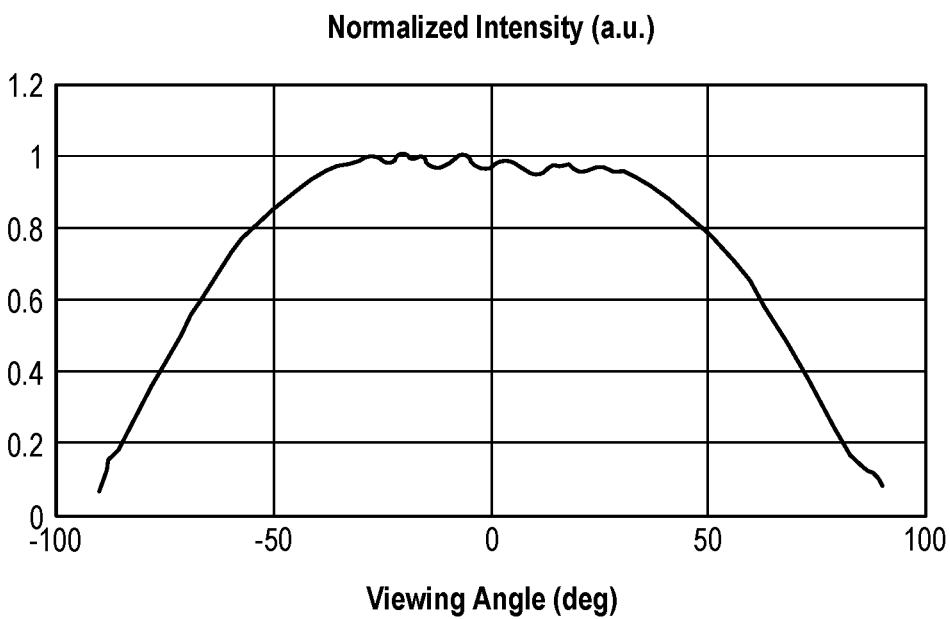
FIG. 12A is a graph illustrating a light emission intensity according to a viewing angle of a light emitting diode without a distributed Bragg reflector on a light emitting surface side.
Figure 12B:
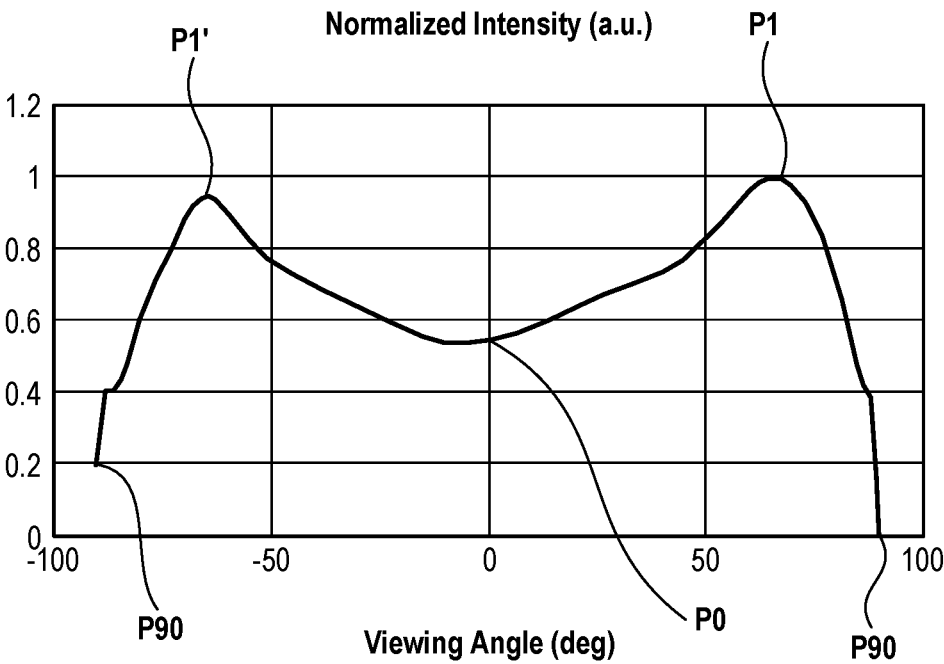
FIG. 12B is a graph illustrating a light emission intensity according to a viewing angle of a light emitting diode with a distributed Bragg reflector on a light emitting surface side.

FIG. 12A is a graph illustrating a light emission intensity according to a viewing angle of a light emitting diode without a distributed Bragg reflector on a light emitting surface side, and FIG. 12B is a graph illustrating a light emission intensity according to a viewing angle of a light emitting diode with a distributed Bragg reflector on a light emitting surface side.

Herein, the distributed Bragg reflector is the distributed Bragg reflector according to the second embodiment having the reflectance of about 50% at the incident angle of about 70 degrees. In a case of a light emitting diode that does not use the distributed Bragg reflector, as shown in FIG. 12A, a high emission intensity is exhibited at a viewing angle of 0 degree, and the intensity decreases as the viewing angle increases. In a case of a light emitting diode that uses the distributed Bragg reflector, as shown in FIG. 12B, a relatively low light emission intensity is exhibited near the viewing angle of 0 degrees, and a highest light emission intensity is exhibited near a viewing angle of about 60 degrees. At least one luminous intensity P1 of a first peak is exhibited between 0 degrees and 90 degrees of the viewing angles, and a luminous intensity P0 at the viewing angle of 0 degree may be greater than a luminous intensity P90 at the viewing angle of 90 degrees and smaller than the luminous intensity P1 of the first peak. In addition, the luminous intensity may continuously increase from 0 degrees to the first peak. In addition, a luminous intensity P1' of at least one second peak is exhibited between the viewing angle of 0 degree and –90 degrees, and the luminous intensity P0 at the viewing angle of 0 degree may be greater than a luminous intensity P90' at the viewing angle of –90 degrees and may be smaller than the luminous intensity P1' of the second peak. In addition, the luminous intensity may continuously increase from 0 degrees to the second peak.

As described above, by applying a distributed Bragg reflector in which the reflectance decreases at an arbitrary incident angle without being limited to the incident angle of about 70 degrees, the luminous intensity of light emitted near 0 degree of the viewing angle may be made smaller than the luminous intensity P1 of the first peak, and it is possible to implement uniform surface emission suitable for a back light unit using this.

The distributed Bragg reflectors described above may be applied to the light emitting diode 200 as well as the light emitting diode 100. In addition, the light emitting diodes 100 and 200 may be used in various application fields, and in particular, may be used in a back light unit of a display apparatus.

Figure 13:
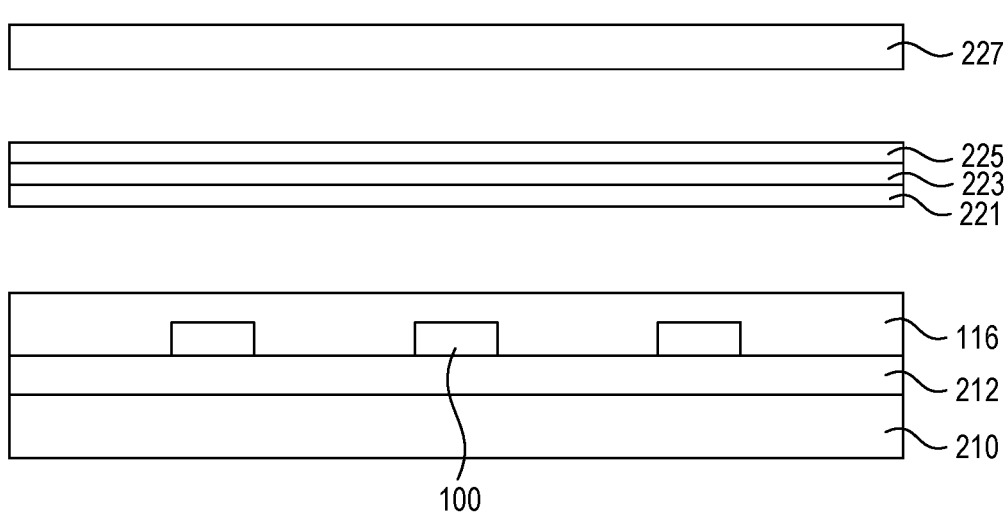
FIG. 13 is a schematic cross-sectional view illustrating a display apparatus according to an embodiment of the present disclosure.
Figure 14:
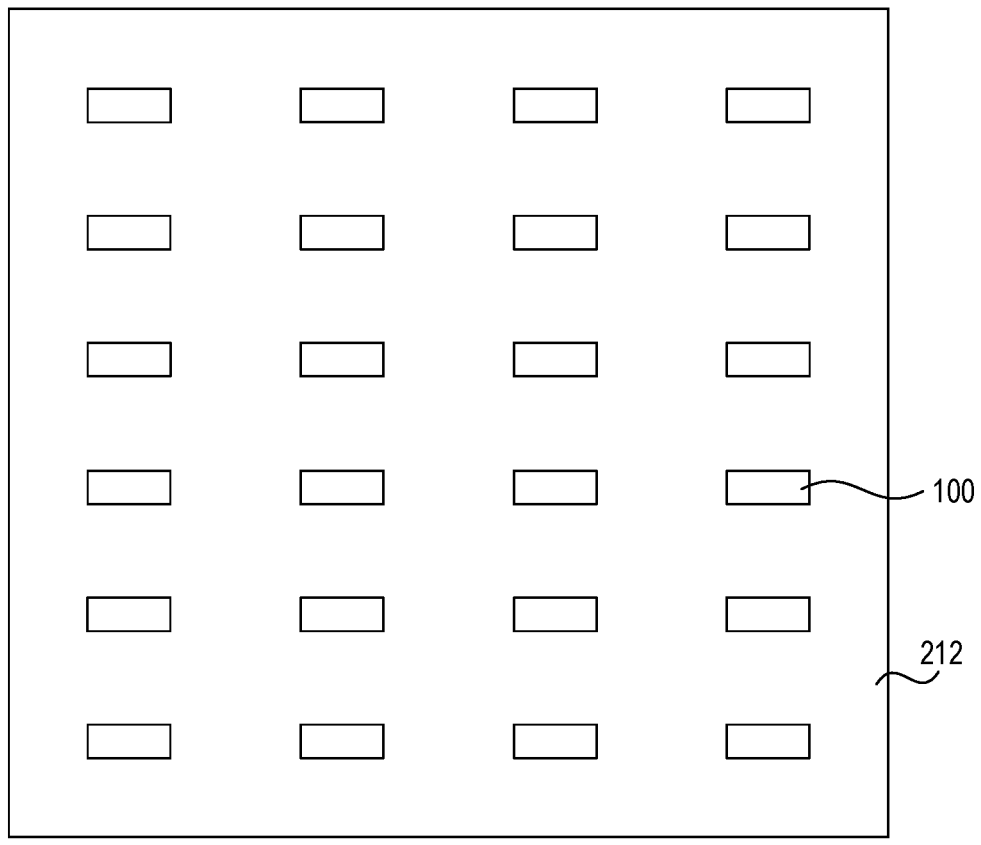
FIG. 14 is a plan view illustrating a back light unit of FIG. 13.
Figure 15:
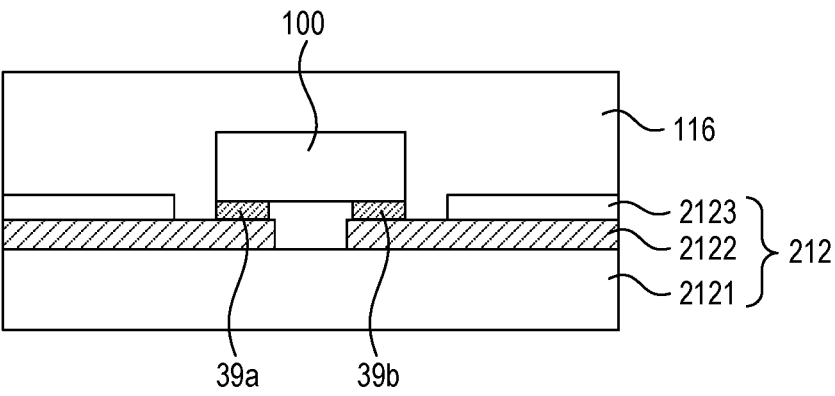
FIG. 15 is a schematic partial cross-sectional view illustrating a back light unit according to an embodiment of the present disclosure.

FIG. 13 is a schematic cross-sectional view illustrating a display apparatus according to an embodiment of the present disclosure, FIG. 14 is a plan view illustrating a back light unit of FIG. 13, and FIG. 15 is a schematic partial cross-sectional view illustrating a back light unit according to an embodiment of the present disclosure.

First, referring to FIG. 13, the display apparatus according to an embodiment of the present disclosure may include a light emitting diode 100, a molding member 116, a frame 210, a circuit board 212, a fluorescent sheet 221, a diffusion plate 223, an optical sheet 225, and a display panel 227.

The frame 210 supports various components of the display apparatus disposed thereon. The frame 210 may be formed of a metal such as an aluminum alloy or a synthetic resin.

The circuit board 212 may be disposed on the frame 210. The circuit board 212 has various circuits for supplying power to the light emitting diodes 100. As shown in FIG. 15, the circuit board 212 may include a substrate body 2121, interconnections 2122, and a solder resist 2123. The substrate body 2121 is formed of an insulating material such as FR4.

The interconnections 2122 are disposed to supply power to the light emitting diode 100. The interconnections 2122 may include externally exposed pad regions for bonding the light emitting diode 100.

The solder resist 2123 covers the interconnections 2122. The solder resist 2123 may be, for example, photoimageable solder resist (PSR), in particular, white PSR. By using the white PSR, light incident on the circuit board 212 may be reflected, thereby improving light efficiency of the back light unit.

The light emitting diodes 100 are arranged on the circuit board 212. The light emitting diodes 100 may be arranged in a matrix, and may be arranged at regular intervals. In an embodiment, a row direction interval between the light emitting diodes may be same as a column direction interval. The light emitting diodes 100 may be electrically connected to the interconnections 2122 on the circuit board 212, and may be independently driven using the interconnections 2122. Herein, the light emitting diodes 100 are exemplarily described, without being limited thereto, and the light emitting diodes 200 may be arranged on the circuit board 212. Since the light emitting diodes 100 and 200 have been described above, detailed descriptions thereof will be omitted.

The molding member 116 may cover the light emitting diodes 100. The molding member 116 may also cover an upper surface of the circuit board 212. The molding member 116 may be formed of a transparent material capable of transmitting light generated in the light emitting diode 100, and may be formed of, for example, silicone. In particular, the molding member 116 may be formed of phenyl-based silicone. In addition, if necessary, a phosphor or a diffuser may be included in the molding member 116.

The fluorescent sheet 221 is provided to convert light emitted from the light emitting diode 100 into light of a different wavelength. The fluorescent sheet 221 may include one or more types of fluorescent materials or quantum dots (QDs) therein. In this specification, the fluorescent sheet 221 includes a QD sheet. The fluorescent sheet 221 may be disposed over the molding member 116, and may be disposed to be in close contact with the molding member 116. However, the inventive concepts are not limited thereto, and the fluorescent sheet 221 may be spaced apart from the molding member 116, or another optical member may be disposed between the fluorescent sheet 221 and the molding member 116. In this embodiment, light emitted from the light emitting diode 100 may be blue light or ultraviolet light, and white light may be implemented by light emitted from the light emitting diode 100 and light emitted through the fluorescent sheet 221.

The diffusion plate 223 diffuses light emitted from the light emitting diodes 100 to disperse the light. The optical sheet 225 may be disposed over the diffusion plate 223, and the display panel 227 may be disposed over the optical sheet 225. The optical sheet 225 may include a plurality of sheets having different functions from one another. For example, one or more prism sheets and diffusion sheets may be included. The diffusion sheet may prevent light emitted through the diffusion plate 223 from being partially concentrated, thereby making a brightness of light more uniform. The prism sheet may make light emitted through the diffusion sheet being vertically incident to the display panel 227.

The display panel 227 is disposed on a front surface of the display apparatus, and may display an image. The display panel 227 may include a plurality of pixels, and may output an image according to color, brightness, saturation, and the like for each pixel.

Figure 16:
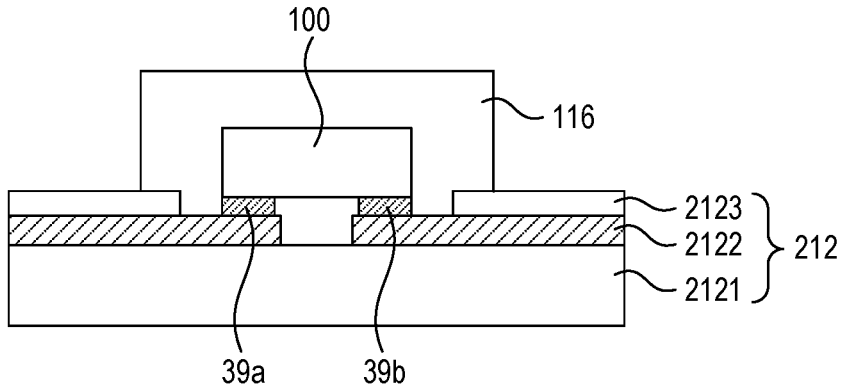
FIG. 16 is a schematic partial cross-sectional view illustrating a back light unit according to another embodiment of the present disclosure.

FIG. 16 is a schematic partial cross-sectional view illustrating a back light unit according to another embodiment of the present disclosure.

Referring to FIG. 16, the molding member 116 previously described with reference to FIG. 15 is continuously formed on the circuit board 212 to cover all of the light emitting diodes 100. On the contrary, in this embodiment, a molding member 116a covers each of the light emitting diodes 100. Accordingly, the upper surface of the circuit board 212 may be exposed between the molding members 116a.

Figure 17:
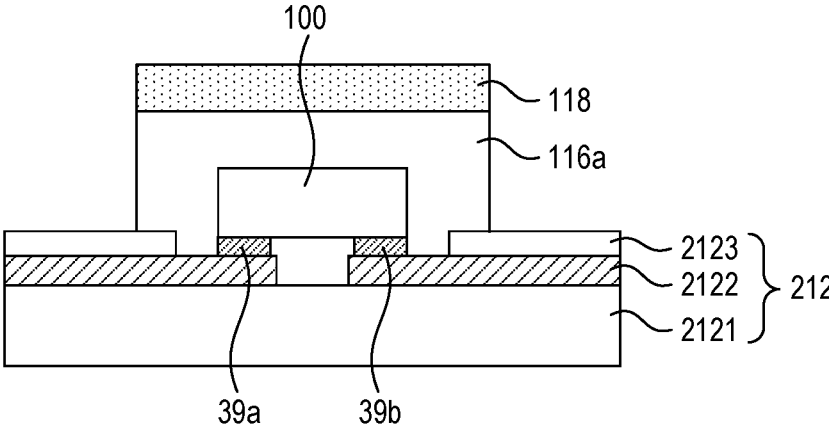
FIG. 17 is a schematic partial cross-sectional view illustrating a back light unit according to another embodiment of the present disclosure.

FIG. 17 is a schematic partial cross-sectional view illustrating a back light unit according to another embodiment of the present disclosure.

Referring to FIG. 17, a reflection resin 118 may be disposed on a molding member 116a. The reflection resin 118 may be white silicone, for example. The reflection resin 118 reflects light emitted from the light emitting diode 100 in a vertical direction. The reflection resin 118 may be used instead of the insulation reflection layer 41, or may be used together with the insulation reflection layer 41.

Figure 18:
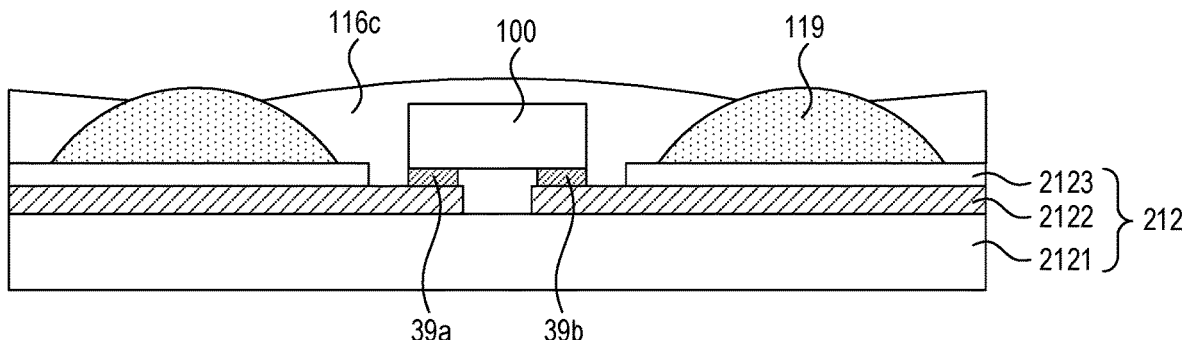
FIG. 18 is a schematic partial cross-sectional view illustrating a back light unit according to another embodiment of the present disclosure.

FIG. 18 is a schematic partial cross-sectional view illustrating a back light unit according to another embodiment of the present disclosure.

Referring to FIG. 18, a reflection resin 119 may be disposed around the light emitting diode 100. The light emitting diode 100 may be surrounded by the reflection resin 119, and a molding member 116c may cover the light emitting diode 100 by filling a region surrounded by the reflection resin 119. The reflection resin 119 may be white silicone, for example. Light emitted from the light emitting diode 100 may be reflected by the reflection resin 119.

Figure 19:
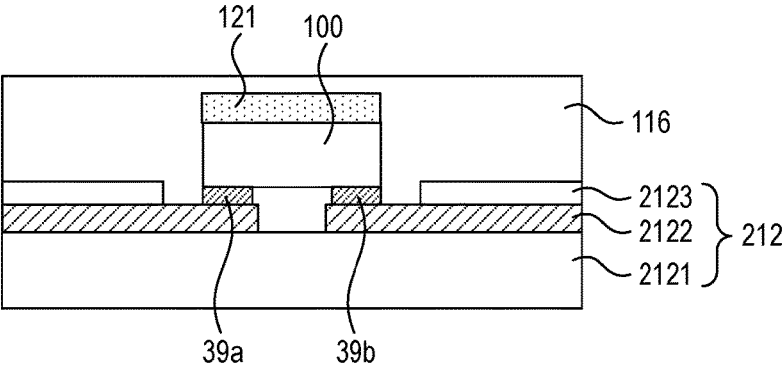
FIG. 19 is a schematic partial cross-sectional view illustrating a back light unit according to another embodiment of the present disclosure.

FIG. 19 is a schematic partial cross-sectional view illustrating a back light unit according to another embodiment of the present disclosure.

Referring to FIG. 19, a wavelength converter 121 may be disposed on the light emitting diode 100. The molding member 116 may cover the wavelength converter 121 together with the light emitting diode 100. The wavelength converter 121 may include phosphors or quantum dots. The wavelength converter 121 may be used together with the fluorescent sheet 221, or may be used instead of the fluorescent sheet 221.

Although various exemplary embodiments of the present disclosure are described, the present disclosure is not limited to these exemplary embodiments, and may be variously modified. In addition, it should be understood that features or components of one exemplary embodiment can also be applied to other exemplary embodiments without departing from the spirit and scope of the present disclosure.

The invention claimed is:

1. A light emitting diode, comprising:
   a substrate;
   a light emitting structure disposed on the substrate, and including a first conductivity type semiconductor layer, an active layer, and a second conductivity type semiconductor layer;
   a transparent electrode disposed on and in ohmic contact with the second conductivity type semiconductor layer;
   a contact electrode disposed on the first conductivity type semiconductor layer;
   a current spreader disposed on the transparent electrode;
   a first insulation reflection layer covering the substrate, the light emitting structure, the transparent electrode, the contact electrode, and the current spreader, the first insulation reflection layer having openings exposing portions of the contact electrode and the current spreader, and including a distributed Bragg reflector;
   a first pad electrode and a second pad electrode that are disposed on the first insulation reflection layer, and connected to the contact electrode and the current spreader through the openings, respectively; and
   a second insulation reflection layer disposed under the substrate, and including a distributed Bragg reflector,
   wherein a reflection band of the second insulation reflection layer is narrower than a reflection band of the first insulation reflection layer.

2. The light emitting diode of claim 1, wherein the reflection bands of the first and second insulation reflection layers have reflectance of 98% or more.

3. The light emitting diode of claim 1, wherein the contact electrode and the current spreader have a same layer structure including same material.

4. The light emitting diode of claim 3, wherein a length of the contact electrode is longer than that of the current spreader.

5. The light emitting diode of claim 1, wherein at least a portion of light generated in the active layer is reflected from the second insulation reflection layer and emitted sidewards.

6. The light emitting diode of claim 1, wherein:
   the first insulation reflection layer has a reflectance of 95% or more within a range of 410 nm to 700 nm, and
   the second insulation reflection layer has a reflectance of 95% or more within a wavelength range of 370 nm to 520 nm.

7. The light emitting diode of claim 1, wherein:
   the first insulation reflection layer has a reflectance of 98% or more within a range of 410 nm to 690 nm, and
   the second insulation reflection layer has a reflectance of 98% or more within a wavelength range of 380 nm to 500 nm.

8. The light emitting diode of claim 1, wherein within a wavelength range of 550 nm to 700 nm, the second insulation reflection layer has a reflectance lower than that of the first insulation reflection layer.

9. The light emitting diode of claim 1, wherein the second insulation reflection layer has a first reflectance lower than a reflectance of the first insulation reflection layer at a first incident angle within a range of 0 to 90 degrees.

10. The light emitting diode of claim 9, wherein:
   the second insulation reflection layer has a second reflectance lower than the reflectance of the first insulation reflection layer at a second incident angle within the range of 0 to 90 degrees, and
   the first and second reflectances are local minimum reflectances, and the second reflectance is different from the first reflectance.

11. The light emitting diode of claim 1, wherein the light emitting diode is configured to exhibit a luminous intensity of a first peak at a first viewing angle between 0 degrees and 90 degrees.

12. The light emitting diode of claim 11, wherein a luminous intensity at the viewing angle of 0 degree is greater than a luminous intensity at the viewing angle of 90 degrees and less than the luminous intensity of the first peak.

13. The light emitting diode of claim 11, wherein a luminous intensity increases as a viewing angle increases from the viewing angle of 0 degree to the first viewing angle.

14. The light emitting diode of claim 11, wherein the first viewing angle is greater than 50 degrees.

15. The light emitting diode of claim 1, wherein each of the contact electrode and the current spreader includes an ohmic metal layer for ohmic contact with the first conductivity type semiconductor layer and a metal reflection layer for reflecting light generated in the active layer.

16. The light emitting diode of claim 1, wherein:
   with respect to light generated in the active layer at a specific angle of incidence,
   the first insulation reflection layer has a reflectance of 90% or more, and
   the second insulation reflection layer has a reflectance of 90% or less.

17. The light emitting diode of claim 16, wherein the second insulation reflection layer has the reflectance of 50% or less at a specific incident angle.

18. The light emitting diode of claim 1, wherein:

the substrate has a rectangular shape with a major axis and a minor axis, and at least one of side surfaces of the substrate is inclined at an inclination angle of 80 degrees to 85 degrees with respect to a lower surface of the substrate.

19. The light emitting diode of claim 18, wherein the substrate includes a roughened surface on the side surface.

20. The light emitting diode of claim 19, wherein the roughened surface is formed along a periphery of the substrate.

21. A display apparatus, comprising:

a circuit board; and a light emitting diode arranged on the circuit board, and wherein the light emitting diode includes:

a substrate;

a light emitting structure disposed on the substrate, and including a first conductivity type semiconductor layer, an active layer, and a second conductivity type semiconductor layer;

a transparent electrode disposed on and in ohmic contact with the second conductivity type semiconductor layer;

a contact electrode disposed on the first conductivity type semiconductor layer;

a current spreader disposed on the transparent electrode;

a first insulation reflection layer covering the substrate, the light emitting structure, the transparent electrode, the contact electrode, and the current spreader, the first insulation reflection layer having openings exposing portions of the contact electrode and the current spreader, and including a distributed Bragg reflector;

a first pad electrode and a second pad electrode that are disposed on the first insulation reflection layer, and connected to the contact electrode and the current spreader through the openings, respectively; and a second insulation reflection layer disposed under the substrate, and including a distributed Bragg reflector, wherein a reflection band of the second insulation reflection layer is narrower than a reflection band of the first insulation reflection layer.

* * * * *